(12) United States Patent
Shubat et al.

(10) Patent No.: US 6,363,020 B1
(45) Date of Patent: Mar. 26, 2002

(54) ARCHITECTURE WITH MULTI-INSTANCE REDUNDANCY IMPLEMENTATION

(75) Inventors: Alex Shubat, Fremont; Chang Hee Hong, Newark, both of CA (US)

(73) Assignee: Virage Logic Corp., Fremont, CA (US)

(*) Notice: Subject to any disclaimer, the term of this patent is extended or adjusted under 35 U.S.C. 154(b) by 0 days.

(21) Appl. No.: 09/455,045

(22) Filed: Dec. 6, 1999

(51) Int. Cl.$^7$ ................................................. G11C 7/00
(52) U.S. Cl. ............... 365/200; 365/225.7; 365/189.02; 365/189.12
(58) Field of Search ............... 365/200, 225.7, 365/189.12, 189.02

(56) References Cited

U.S. PATENT DOCUMENTS

| | | | |
|---|---|---|---|
| 5,255,227 A | 10/1993 | Haeffele | 365/200 |
| 5,301,153 A | 4/1994 | Johnson | 365/200 |
| 5,430,679 A * | 7/1995 | Heltebeitel et al. | 365/200 |
| 5,604,702 A * | 2/1997 | Tailliet | 365/200 |
| 5,608,678 A | 3/1997 | Lysinger | 365/200 |
| 5,668,818 A | 9/1997 | Bennett et al. | 371/22.31 |
| 5,841,712 A * | 11/1998 | Wendell et al. | 365/200 |
| 5,859,801 A | 1/1999 | Poechmueller | 365/200 |
| 6,002,620 A * | 12/1999 | Tran et al. | 365/200 |

FOREIGN PATENT DOCUMENTS

| | | |
|---|---|---|
| EP | 0158006 A2 | 1/1985 |
| EP | 0867810 A2 | 3/1998 |

* cited by examiner

*Primary Examiner*—Richard Elms
*Assistant Examiner*—Tuan T. Nguyen
(74) *Attorney, Agent, or Firm*—Smith, Danamraj & Youst, P.C.

(57) ABSTRACT

A semiconductor memory architecture for embedded memory instances having redundancy. A fuse box register is provided outside the memory macro associated with the memory instances. The memory instances are daisy-chained to the fuse box register containing a plurality of fuses used for storing fuse data associated with the defective rows and columns of main memory. During power-up or after blowing the fuses, the contents of the fuses (i.e., fuse data) are transferred to a plurality of volatile redundancy scan flip-flops. The fuse box is then deactivated to eliminate quiescent current through the fuses. The redundancy scan flip-flops, connected in a scan chain, are located inside the fuse box as well as the memory instances. During the shifting mode of operation, the fuse contents are scanned into individual flip-flops, organized as scan registers for row redundancy and column redundancy, of the memory instances. Redundant elements are pre-tested by bypassing the fuses and directly scanning in arbitrary patterns into the redundancy scan flip-flops (override mode operation). The contents of row redundancy scan register (i.e., faulty wordline address information) are compared with an incoming wordline address and if there is a match found, the primary wordline or wordlines are de-selected and the redundant wordline or wordlines are selected.

22 Claims, 15 Drawing Sheets

ARCHITECTURE WITH MULTI-INSTANCE REDUNDANCY IMPLEMENTATION

BACKGROUND OF THE INVENTION

1. Technical Field of the Invention

The present invention relates generally to semiconductor memories, and more particularly, to memory compilers for semiconductor memories with redundant memory cells and fuses for storing faulty memory cell data, wherein the semiconductor memories are preferably provided for embedded System-On-Chip (SOC) applications.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well-known that memory is a key technology driver for SOC design. Although providing high quality embedded memory IP in SOC applications poses several challenges, the total density of embedded memory has been increasing rapidly. It should be readily appreciated by those of ordinary skill in the art that without the use of redundancy, the fabrication yields of SOC devices and other embedded memory systems will be very low.

Several techniques exist for providing redundancy in conventional stand-alone, single-chip memories. In fact, such redundancy techniques have been largely responsible for the ever-increasing densities of the single-chip memories. Incorporating conventional redundancy schemes in embedded memory IP applications, however, has numerous shortcomings and drawbacks. First, providing redundancy using the existing techniques is a cost-effective solution only when the memory density is greater than a certain minimum number of bits. It is generally accepted that if the support circuitry needed for redundancy occupies more than 5% of the memory area, the design is not area-efficient.

It should be readily apparent that such requirements pose a great difficulty in the area of embedded memory design. For example, the embedded memories are typically provided in various sizes (i.e., densities) and distributed throughout the system (i.e., different memory instances). The requirement of redundancy in smaller memory instances, accordingly, would result in an unacceptably large redundancy overhead (that is, high area-inefficiency).

Further, conventional redundancy techniques typically involve placing fuse elements within the memory array for effectuating row redundancy and column redundancy. In general, they are placed in row decoders, faulty address storage areas, column fuse banks, et cetera. It should be readily appreciated that such schemes give rise to inefficient layouts because routing over fuse areas is not allowed, thereby causing routing congestion and related "place and route" problems. Also, because of the routing bottlenecks around the fuse areas, creating multi-level power grids may not be feasible in SOC circuits.

In addition, because there are limits to how small a laser-activated fuse element needs to be, the size of fuse elements does not scale in correspondence with the size of memory core cells. Relatedly, the pitch of fuses normally does not match the pitch of memory cells. Accordingly, it would be very difficult to tile fuses and connect fuses to periphery layouts, especially in the context of memory compilers that need to be highly flexible in terms of supporting different memory configurations and types for embedded applications.

Based on the foregoing, it should be readily apparent that there has arisen an acute need for a semiconductor memory architecture solution that advantageously overcomes these and other deficiencies of the prior art technologies as set forth hereinabove.

SUMMARY OF THE INVENTION

Accordingly, it is an object of the present invention to provide a scalable memory compiler for designing an arbitrary number and size of embedded memory instances with redundancy. It is a further object of the present invention to minimize area overhead associated with adding redundancy. Yet further object of the present invention relates to minimizing speed/performance impact due to redundancy. Still further objects of the present invention include: minimizing power consumption increase and maintaining zero power consumption, and providing flexibility in terms of fixing various types of defects.

In one aspect, the present invention is directed to a memory architecture having redundancy. A fuse box register (provided outside the memory macro) and an arbitrary number of memory instances are connected in a daisy chain. The fuse box register contains a plurality of fuses used for storing locations of defective rows and columns of a main memory array. During power-up or after blowing the fuses, the contents of the fuses (i.e., fuse data) are transferred to a plurality of volatile redundancy scan flip-flops. The fuse box register is then deactivated to eliminate quiescent current through the fuses. The redundancy scan flip-flops, connected in a scan chain, are located inside the fuse box register as well as the memory instances. During the shifting mode of operation, the fuse contents are scanned into individual flip-flops (organized as volatile scan registers) of the memory instances. Redundant elements are pre-tested by bypassing the fuses and directly scanning in arbitrary patterns into the redundancy scan flip-flops (override mode). Row and column redundancy is effectuated using the contents of the redundancy scan flip-flops.

In another aspect, the present invention is directed to a method of effectuating a redundancy scheme in a memory circuit. The redundancy method provides a fuse area outside a main memory area of the memory circuit, wherein the fuse area is used for storing fuse information corresponding to faulty locations of the main memory area. The method also provides a plurality of redundancy scan flip-flops in the main memory area. A redundant memory area of the memory circuit is pre-tested to verify its functionality. The main memory area is tested thereafter to determine faulty locations. Information corresponding the faulty locations is then stored in the fuse area. Upon power-up of the memory circuit, the redundancy scan flip-flops are reset and the fuse information is scanned into the flip-flops. Based on the fuse information stored in the plurality of redundancy scan flip-flops, the faulty locations in the main memory area are replaced with redundant locations.

In a further aspect, the present invention relates to an integrated semiconductor device which comprises a plurality of memory instances embedded in the integrated semiconductor device's circuitry, wherein at least one of the plurality of memory instances comprises a prime memory array and a redundant memory portion. A volatile scan register comprising a plurality of concatenated flip-flops is disposed in the memory instance with redundant memory portion. A fuse box register is disposed external to the plurality of memory instances (i.e., memory macro) in a selected area of the integrated semiconductor device. The fuse box register includes a plurality of fuses for storing fuse information/data, each fuse being in either an open or closed state. Preferably, the fuse data is related to the location data of one or more faulty portions in the prime memory array. Also provided is means for transferring the fuse information to the volatile scan register upon a reset and power-up of the integrated semiconductor device. The fuse information is used in the course of operation of the integrated semiconductor device for replacing a faulty portion in the prime memory array with at least a part of the redundant memory portion.

In yet further aspect, the present invention is directed to a memory compiler for use with designing an integrated semiconductor device wherein the device includes a plurality of embedded memory instances. At least one of the plurality of embedded memory instances includes a redundant portion. The compiler is comprised of a memory macro cell associated with the plurality of embedded memory instances. A fuse box register is located outside the memory macro and includes a plurality of fuses for storing fuse information in order to effectuate a replacement of a faulty memory portion in the embedded memory instance with the redundant portion. Also provided is a plurality of redundancy scan flip-flops located in the memory macro associated with the embedded memory instances. The fuse information is scanned into the redundancy scan flip-flops at power-up of the integrated semiconductor device. In one embodiment, the redundancy scan flip-flops are organized into a scan register and the faulty memory portion includes a faulty wordline. A portion of the scan register contains an address of the faulty wordline, wherein the scan register is coupled to a comparator provided for comparing a row address with the address of said faulty wordline. The comparator generates a control signal for effectuating a replacement of the faulty wordline with a wordline provided in the redundant portion when there is a match between the row address and the address of the faulty wordline.

In another embodiment, the memory compiler includes a plurality of 2:1 multiplexers, the output of each of which is provided to a corresponding I/O block of the memory instance. Each 2:1 multiplexer receives inputs from two sense amplifiers coupled to adjacent column blocks, including a redundant column block provided in the redundant portion. The faulty memory portion preferably includes a faulty column block. The redundancy scan flip-flops are organized into a scan register, the contents of which provide control signals to the 2:1 multiplexers for steering one of their respective sense amplifier inputs to the corresponding column I/O.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1A:
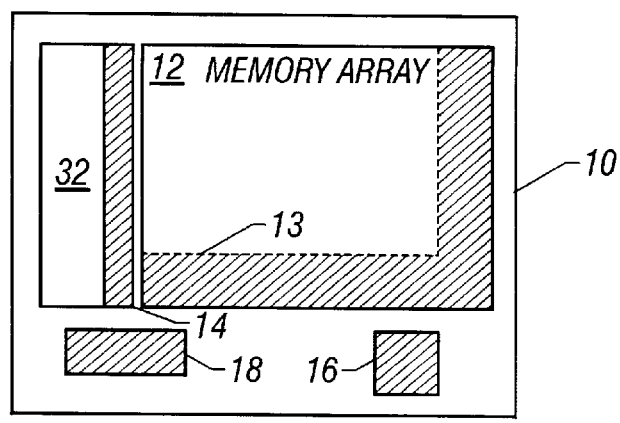
FIG. 1A (Prior Art) depicts a simplified layout of a conventional stand-alone memory chip with redundancy.

In the drawings, like or similar elements are designated with identical reference numerals throughout the several views thereof, and the various elements depicted are not necessarily drawn to scale. Referring now to FIG. 1A, depicted therein is a simplified layout of a conventional stand-alone memory chip 10 with redundancy. An array of memory cells 12 (e.g., Static Random Access Memory or SRAM, Dynamic Random Access Memory or DRAM, Electrically Programmable Read-Only Memory or EPROM, and the like), including a redundant portion 13, is provided in a conventional organization (i.e., N rows by M columns, in ×8 or ×16 outputs, et cetera). A row fuse area 14 is provided near a row-decode area 32 in the memory chip 10 wherein fuses coupled to faulty rows or wordlines are laser-blown during the testing of the memory chip 10 so as to de-select or disable the faulty wordlines. Similarly, a column fuse area 16 is also provided in the memory chip 10 for implementing column redundancy. A fuse logic/storage area 18 is included wherein appropriate circuitry is provided for storing the addresses or location information of faulty rows and columns, and for comparing externally supplied addresses with the faulty addresses to produce relevant selecting and de-selecting signals. The chip area comprising the fuse areas 14 and 16, redundant portion 13, and fuse logic/storage area 18, may be termed "redundancy overhead" because that area is not used for creating the primary memory cells.

Figure 1B:
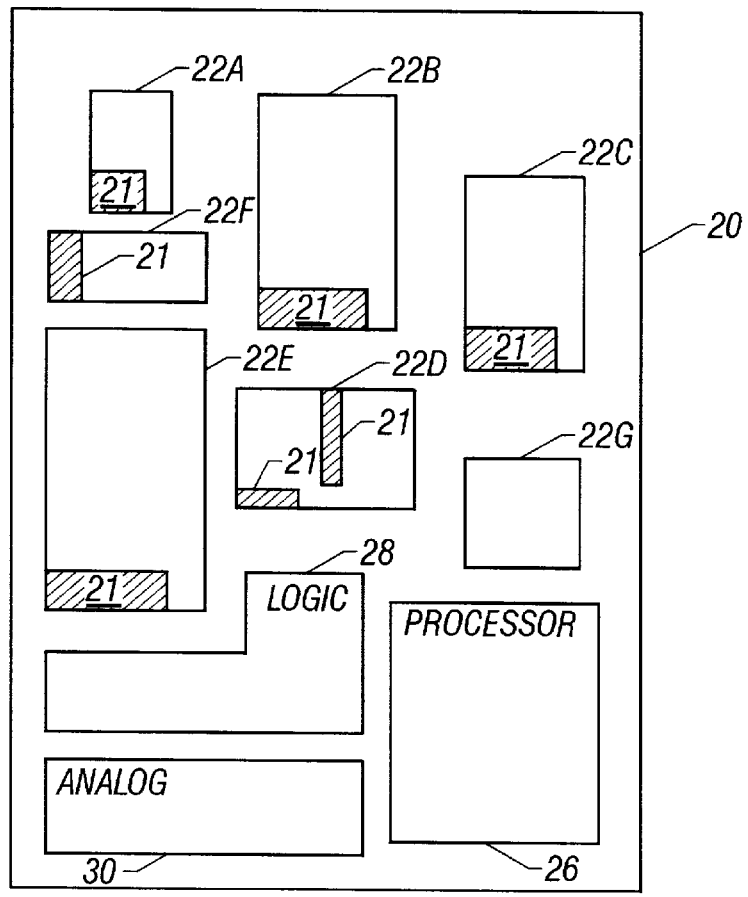
FIG. 1B (Prior Art) depicts a simplified layout of a typical SOC device having a plurality of embedded memory instances wherein some of the memory instances are provided with conventional redundancy implementations.

FIG. 1B depicts a simplified layout of a typical SOC device 20 having a plurality of embedded memory instances, for example, 22A through 22G, in addition to other blocks such as a logic block 28, an analog block 30, and a processor block 26. As is well-known in the industry, the embedded memory instances may comprise a variety of memory types. Furthermore, a portion of the embedded memory instances may include row and/or column redundancy in a conventional manner as set forth above with respect to the stand-alone memory device 10. In each of the memory instances having redundancy, the overhead is cumulatively exemplified by an overhead area 21.

Figure 2A:
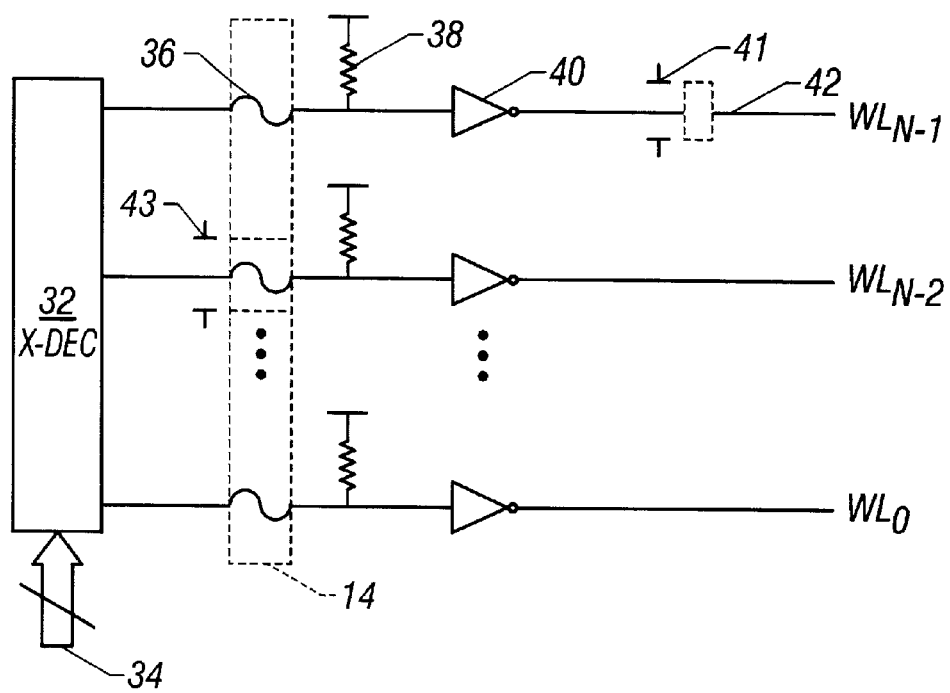
FIGS. 2A–2C (Prior Art) depict a simplified row redundancy scheme used in conventional implementations.
Figure 2B:
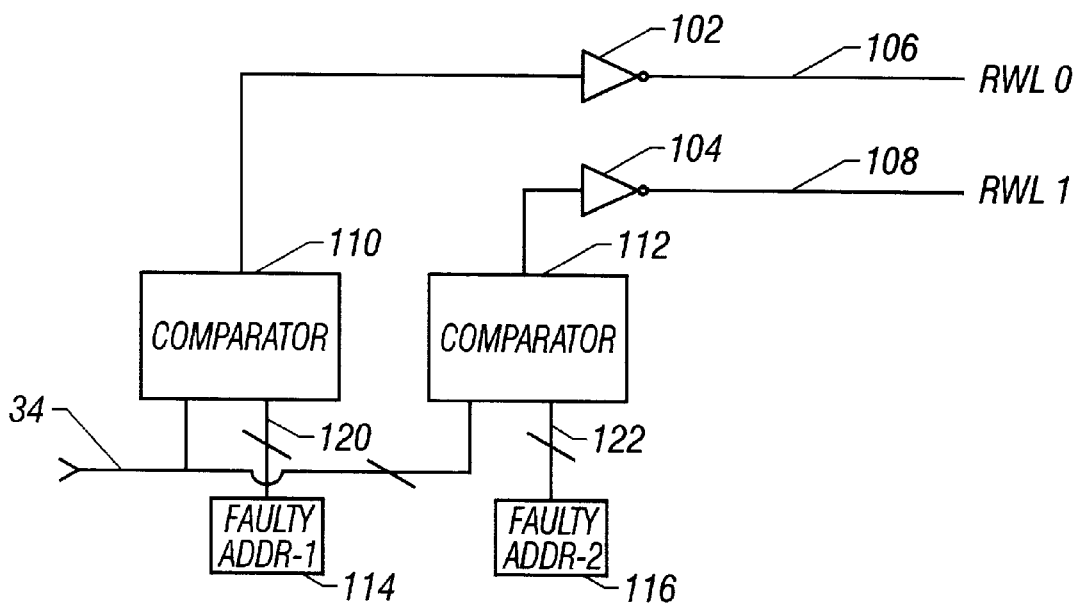
Figure 2C:
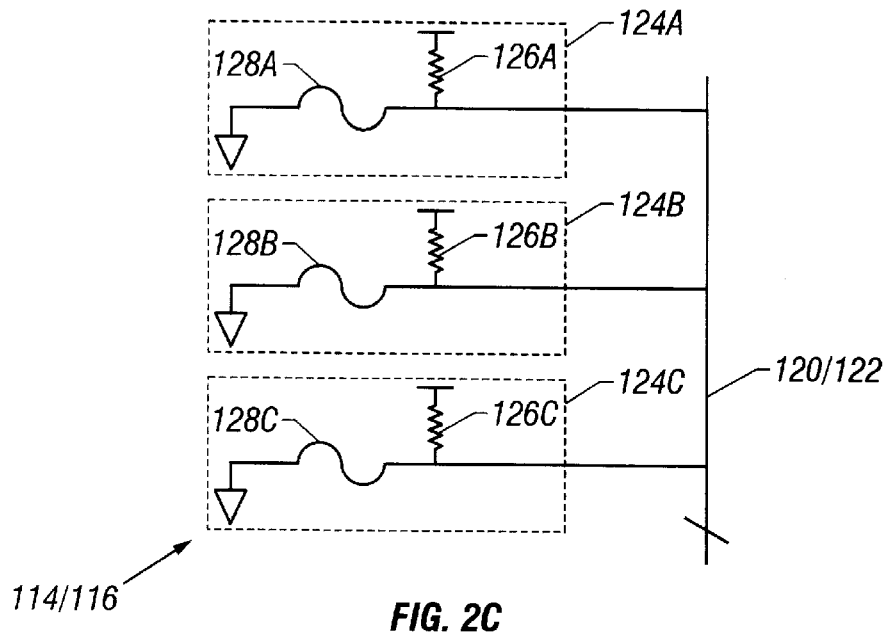

FIGS. 2A–2C depict a simplified conventional row redundancy scheme used in stand-alone memories and SOC devices such as those described hereinabove. A row decoder, such as the row-decode 32 which may typically include pre-decoders, multi-stage decoders, et cetera, decodes externally-supplied address signals 34 in order to select a particular row or wordline, for example, $WL_{N-1}$ 42, among a plurality of wordlines ($WL_0$–$WL_{N-1}$) of the memory array or instance. A fuse 36 is provided between the row decoder 32 and $WL_{N-1}$ 42, with appropriate logic such that when the fuse 36 is laser-blown, i.e., an "open" is created thereby, a weak pull-up 38 drives the input node of an inverter 40 HIGH. Accordingly, the output node of the inverter 40, which is coupled to the wordline $WL_{N-1}$ 42 is driven LOW, thereby disabling that wordline.

During the testing of the memory, some of the rows may fail for a number of reasons (for example, defects such as inter-row shorts, et cetera, in the fabrication process). Such failing wordlines are disabled by opening the appropriate fuses. Also, the addresses of the failing wordlines are stored in a fuse storage area (for example, the fuse logic/storage area 18 shown in FIG. 1A). As is well-known, these faulty addresses are used subsequently in appropriate comparator logic blocks for effectuating the selection of one or more redundant wordlines.

In some implementations, each $WL_i$ is provided with a fuse arrangement described above. In such cases, faulty wordlines are typically replaced one by one. In other conventional implementations, however, a block of wordlines is provided with a single fuse, thereby facilitating the disabling of the entire block and replacing it with a redundant block.

In FIG. 2B, a simplified redundant row selection scheme is shown. Two redundant wordlines $RWL_0$ 106 and $RWL_1$ 108 are exemplified. Each of the redundant wordlines is coupled to a comparator (comparator 110 or comparator 112) that receives row address signals 34 and a faulty row address stored in a register. For example, the comparator 110 receives the faulty address stored in the register 114 and the comparator 112 receives the faulty address stored in the register 116. The logic arrangement of the comparators 110/112 and inverters 102/104 is such that where there is a match between the incoming row address and a stored faulty address, the output of the inverter 102 or 104 goes HIGH, thereby enabling the selection of a redundant wordline connected thereto.

FIG. 2C depicts a fuse-based register 114 or 116 used for storing a faulty address. A plurality of fuses, for example, fuses 128A–128C, are coupled to a data path 120 or 122 that is connected to the appropriate comparator. Each fuse element (e.g., fuse 128A) is provided with a pull-up resistor, e.g., resistor 126A, such that when the fuse is in an open state, a logic HIGH is provided on the line coupled to it. Similarly, where the fuse is in a closed state, a logic LOW is provided. Accordingly, the combination of the fuses and associated pull-ups represents a logic word corresponding to a faulty wordline in the memory array.

Figure 2D:
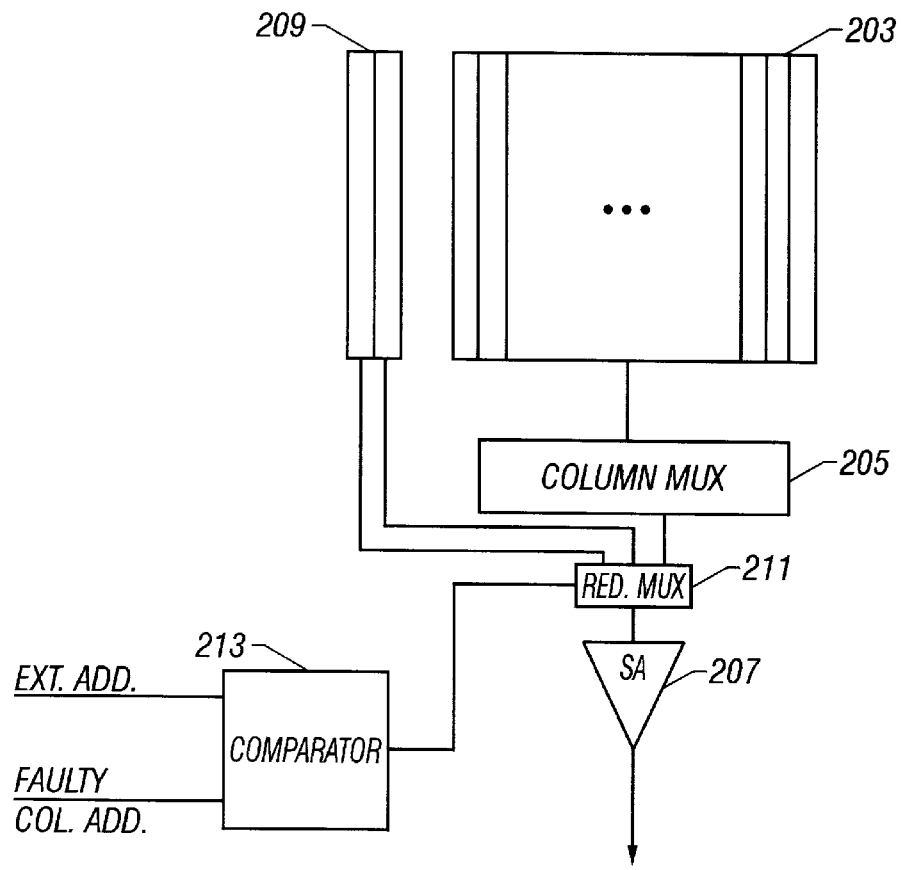
FIGS. 2D and 2E (Prior Art) depict two simplified column redundancy schemes used in conventional implementations.
Figure 2E:
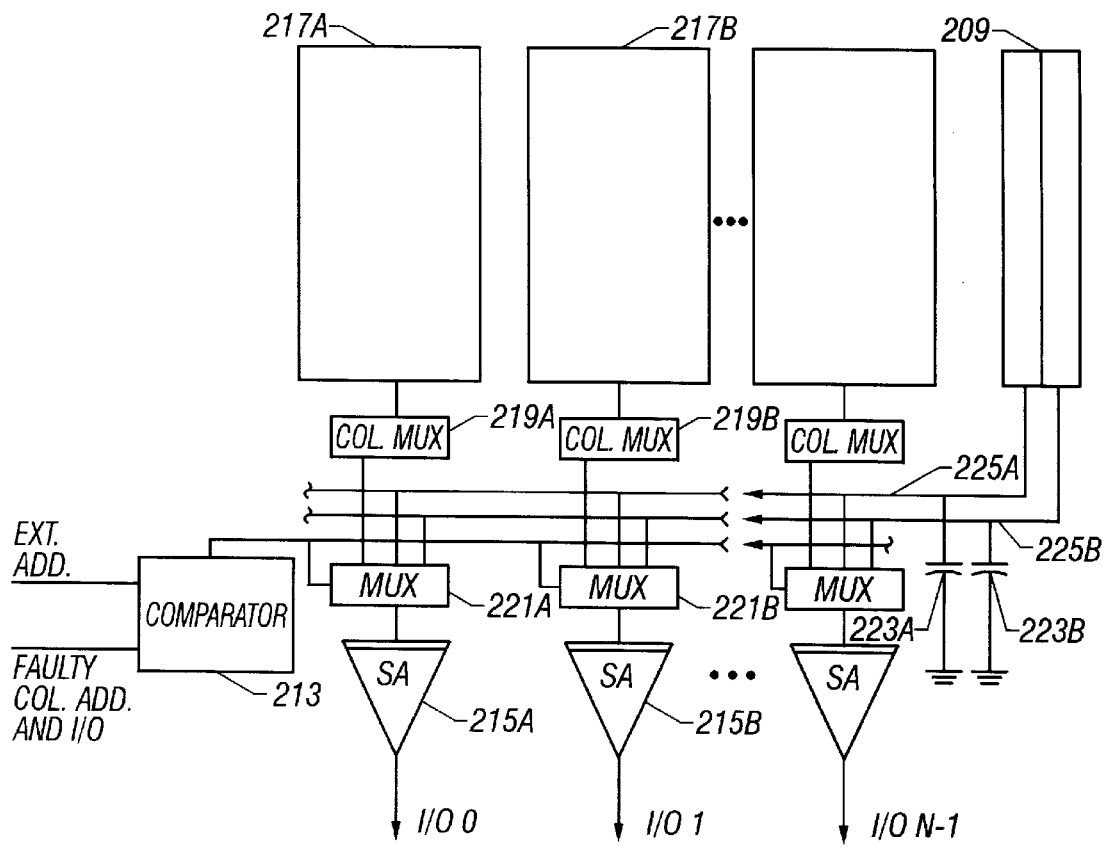

FIGS. 2D and 2E depict two conventional column redundancy schemes, respectively. In the redundancy scheme shown in FIG. 2D, each column block 203 of the memory array (corresponding to an output or I/O line of the array) is provided with its own redundant columns 209. A column multiplexer (MUX) 205 and a sense amplifier (SA) 207 are conventionally provided to select a column (or bitline) for data output. A redundant MUX 211 is disposed between the column MUX 205 and SA 207 for appropriately selecting the redundant columns 209. A comparator 213 compares the external address information with the stored faulty column addresses so as to effectuate the replacement of one or more defective columns. Where there is a column address match, the output of the comparator 213 is used as a control signal for controlling the redundant MUX 211 which connects its output to the redundant columns. As can be readily appreciated by those of ordinary skill in the art, the particular I/O line address need not be specifically provided to the comparator 213 since each output block has its own redundancy.

In the column redundancy scheme shown in FIG. 2E, the redundant column block 209 is provided as a common redundant block for all output blocks, e.g., blocks 217A, 217B, and so on. Again, each of the output blocks is conventionally provided with a column MUX. A redundant MUX is provided with respect to each I/O line wherein the redundant MUX is disposed between the SA and column MUX associated therewith. For example, I/O 0 is coupled to SA 215A which, in turn, is MUXed to receive inputs from the column MUX 219A or the redundant columns 209. Electrical paths 225A and 225B emanate from the redundancy columns 209 for coupling to each SA/MUX arrangement. A comparator 213 is provided for comparing incoming column addresses with the stored faulty locations. Where there is a match, the comparator 213 generates a control signal for controlling the redundant MUXs in order to effectuate redundancy. The comparator also receives the specific I/O address as an input. It should be readily appreciated that because of the common redundancy block arrangement, the electrical paths from the redundant bitlines span the entire array and are typically highly capacitive, as exemplified by $C_{RBL}$ 223A and $C_{RBL}$ 223B.

As stated in the Background section of the present patent application, the conventional redundancy schemes set forth above have numerous drawbacks and disadvantages which are exemplified hereinbelow with particular reference to FIGS. described thus far. For instance, the row fuse area 14 is very area-inefficient, in addition to generating routing problems. The pitch 41 of the wordlines (i.e., line width plus space) and the row fuse pitch 43 are typically mismatched, which gives rise to tiling problems in the context of memory compilers. Further, the fuse register area (i.e., fuse storage area 18) also contributes to the problem of area-inefficiency, especially in smaller memories where the unusable guard ring area surrounding the fuse areas is disproportionately larger in comparison to higher density memories (since as the array size is doubled, only one more fuse is needed).

With respect to the conventional column redundancy scheme depicted in FIG. 2D, it should be readily appreciated that as the number of columns per output decreases, the overhead becomes increasingly significant, which again is a characteristic of small memories. On the other hand, while the column redundancy scheme provided in FIG. 2E mitigates the overhead problems, it engenders additional disadvantages. For example, speed is negatively impacted because of the highly capacitive electrical paths from the redundant columns, which are provided to each output block of the memory array. Also, such capacitive paths are prone to noise injection and render electrical signals uncontrollable.

Figure 3A:
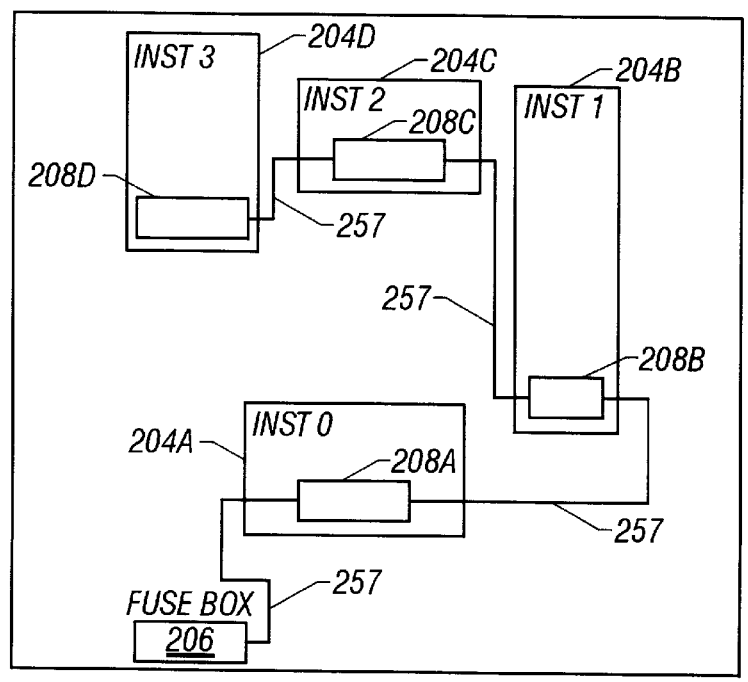
FIG. 3A depicts an exemplary embodiment of a SOC device including a plurality of memory instances wherein redundancy is implemented in accordance with the teachings of the present invention.

Referring now to FIG. 3A, depicted therein is a simplified layout of an integrated circuit device 202 (for example, a SOC device and the like) having a plurality of memory instances, e.g., 204A through 204D, wherein redundancy is implemented in accordance with the teachings of the present invention. An array of fuses 206, as characterized by a Fuse Box™ (wherein the trademark is owned by the assignee of the present patent application and the use of the ™ symbol and/or capital letters is minimized elsewhere in the present patent application, including the claims and drawings, solely for the sake of simplicity), is provided external to the memory instances. That is, in the terminology of memory compiler art, the fuse box/array is provided outside the memory macro or core corresponding to the memory instances wherein all the fuse elements necessary for effectuating redundancy in the memory instances are grouped together for storing information pertaining to faulty memory locations therein. Each of the memory instances includes a prime or main memory array and a redundant portion in any known manner or organization. Preferably, the redundant portions are not required to be of the same size for the memory instances. Further, each of the memory instances is provided with a volatile storage element (e.g., registers 208A through 208D) whose size corresponds to the size of the redundant portion disposed therein.

In accordance with the teachings of the present invention, the memory instances 204A–204D are daisy-chained with the fuse box 206 via a signal path 257, in addition to being coupled to certain enable and clock signals. As will be described in greater detail hereinbelow, signals effectuated on these signal paths are used, upon power-up followed by a reset of the device 202, for transferring or scanning out the contents of the fuse elements in the fuse box to the volatile registers 208A–208D disposed in the memory instances 204A–204D, respectively. The contents of the individual registers 208A–208D are then used for effectuating row redundancy (wordline replacement) or column redundancy (bitline replacement wherein a redundant block of bitlines are selected and a faulty block of primary memory bitlines are de-selected) in a particular memory instance.

As briefly alluded to in the Background section of the present patent application, the advantages of the present invention are more particularly emphasized in the context of memory compilers used for the design of embedded memories, e.g., SOC devices, custom-specific ICs, et cetera. Accordingly, those of ordinary skill in the art should realize upon reference hereto that the present invention may preferably be embodied in any suitable IP form.

Figure 3B:
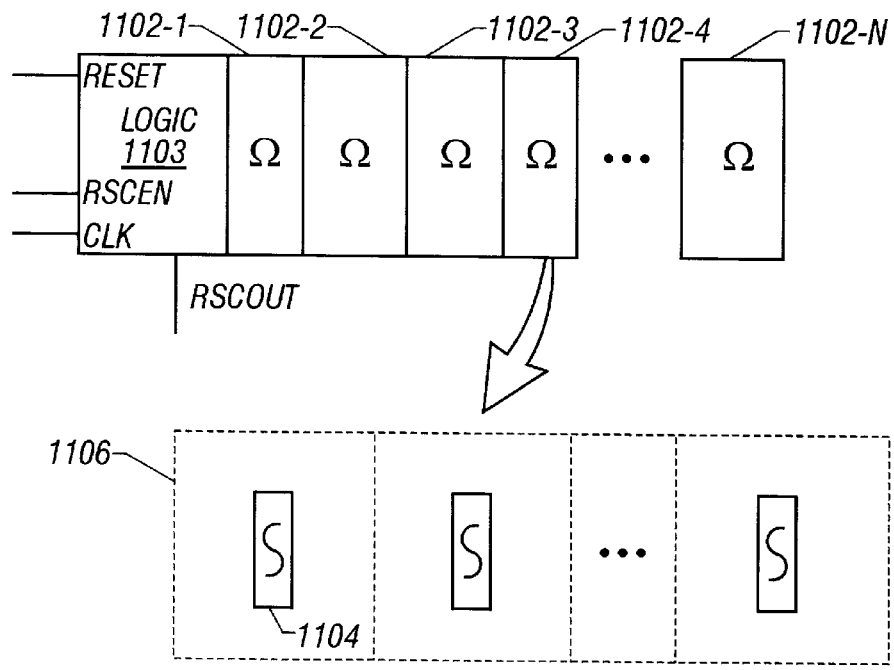
FIG. 3B illustrates the scalability of an exemplary embodiment of a Fuse Box# having an array of fuses (hereinafter "fuse array") provided in accordance with the teachings of the present invention.

FIG. 3B illustrates the scalability of the Fuse Box™ design of the present invention. As is well-known in the semiconductor industry, the benefits of design re-use are maximized when an IP core is usable in, and adaptable to, several configurations and applications. Since the placement of fuse elements is no longer coupled with the memory instances, and because any number of fuses can be easily tiled together, extraordinary flexibility is readily obtained in the present invention. It should be appreciated that the logic area 1103 associated with the fuse box 206 of the present invention remains relatively constant, which includes such components as drivers, clock circuitry, and reset circuitry. Each field of fuses, corresponding to a memory instance, may be viewed as an ohmic component tile (e.g., 1102-1 through 1102-N, where N is design-specific) that is highly scalable without deleterious effects on performance, speed, et cetera. Moreover, because fuses in the each field need to be provided with a guard ring (e.g., guard ring 1106 around fuse 1104), grouping fuses together in a fuse box reduces the large guard ring and associated surrounding area found in conventional fuse implementations, thereby minimizing the area overhead. Furthermore, the redundancy scheme of the present invention as presently preferably embodied in a memory compiler is highly adaptable to a variety of memory configurations, instances, and instance types because of the ease of adding fuses on an "as needed" basis.

Figure 4:
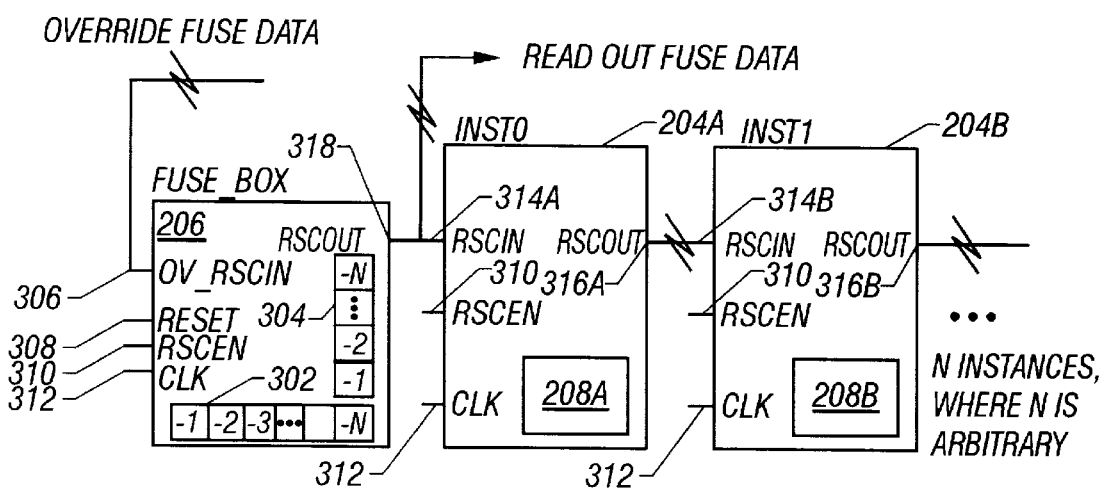
FIG. 4 depicts an exemplary functional block diagram of a Fuse Box™ and an arbitrary number of memory instances daisy-chained thereto in accordance with the teachings of the present invention.
Figure 5A:
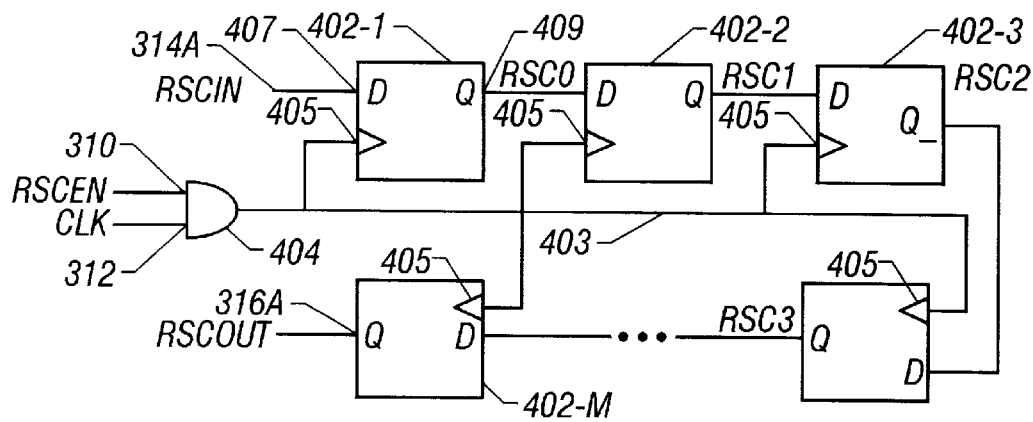
FIG. 5A illustrates an exemplary schematic diagram of a redundancy scan flip-flops provided as a scan chain in a memory instance depicted in FIG. 4.

FIG. 4 depicts an exemplary functional block diagram of the fuse box/array 206 with an arbitrary number of memory instances (labeled as INST-0 through INST-N, where N is arbitrary, and having reference numerals 204A, etc.) that are daisy-chained as described hereinabove. FIG. 5A illustrates an exemplary schematic embodiment of a volatile shift register disposed in each of the plurality of memory instances (and the fuse box, as will be described in greater detail below) as a block of redundancy scan (RSC) flip-flops (FFs) 402-1 through 402-M. A RESET signal 308, RSCEN signal 310, CLK signal 312 and OV_RSCIN signal 306 are provided as inputs to the fuse box 206. The RSCEN 210 and CLK 312 signals are used as inputs to an AND gate 404 that outputs a gated clock signal 403 when both RSCEN and CLK are true (i.e., HIGH). The gated clock signal 403 is applied to the clock inputs 405 of the clocked D flip-flops. In addition to the RSCEN and CLK signals, an RSCOUT signal 318 is provided as an output of the fuse box 206 for daisy-chaining the plurality of memory instances as illustrated. The RSCOUT signal 318 from the fuse box 206 is provided to an RSCIN input (e.g., RSCIN 314A) of the first memory instance 204A, wherein the RSCIN signal line 314A is coupled to the D input 407 of the first redundancy scan flip-flop 402-1. The Q output 409 of the flip-flop 402-1 is then connected to the D input of the next flip-flop 402-2. This arrangement is repeated for all the redundancy scan flip-flops disposed in a memory instance and the Q output of the last flip-flop therein is provided to the RSCOUT output (e.g., RSCOUT 316A) thereof. The RSCOUT signal 316A is connected to the RSCIN input of the next memory instance (e.g., RSCIN 314B of INST1 204B, etc). In this manner, the plurality of memory instances provided in a memory compiler are concatenated.

Figure 5B:
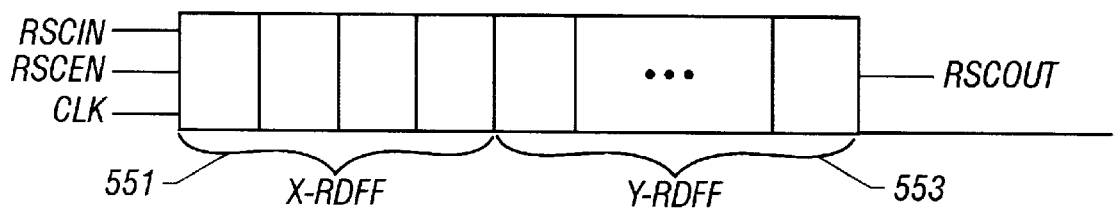
FIG. 5B depicts a block diagram of an exemplary redundancy scan chain provided in a memory instance.

FIG. 5B depicts a block diagram of an RSC flip-flop chain provided in a memory instance, e.g., the RSC flip-flops 402-1 through 402-M exemplified hereinabove, organized into a portion used for row redundancy (X-RDFF) 551 and a portion used of column redundancy (Y-RDFF) 553. The RSCIN signal 314A, RSCEN signal 310, CLK signal 312, and the RSCOUT signal 316A, shown in FIG. 5A, are also illustrated herein.

The fuse box 206 contains a plurality of fuses 302 for storing fuse information or fuse data pertaining to defective wordlines and bitlines of the memory instances. Further, as mentioned above, the fuse box 206 is also provided with a plurality of redundancy scan flip-flops 304 wherein the number of flip-flops (for example, K) preferably equals or is greater than the total number of all flip-flops disposed in the memory instances. The fuses 302 in the fuse box are used to initialize the flip-flops 304 with the fuse data upon power-up or reset. Once the flip-flops 304 are initialized, the data therein is scanned out into the memory using the same flip-flops as scan registers. Preferably, the fuses and FFs in the fuse box are organized as a fuse box register with K register elements depicted in greater detail in FIGS. 6A and 6B. During power-up or after blowing the fuses, the contents thereof (i.e, fuse data or fuse information) are shifted into the volatile flip-flops of the memory instances (i.e., the shifting mode) and the fuse box is deactivated thereafter to eliminate or reduce quiescent current through the fuses. The transferred fuse data in the flip-flops is then used for effectuating row or column redundancy as set forth in greater detail hereinbelow. The fuses may preferably be organized into a number of fields (e.g., an arbitrary N), each fuse field corresponding to one memory instance. It should be apparent that the size of an individual fuse field is dependent upon the amount of redundancy provided in the memory instance associated therewith.

The OV_RSCIN signal 306 is provided for entering arbitrary address or location information in an override mode into the redundancy scan flip-flops 304 provided in the fuse box 206. In the override mode the contents of the fuses are bypassed. By scanning appropriate location information into the redundancy scan flip-flops 304 before the fuse data is entered (i.e., prior to laser-blowing the fuses) and scanning that information out on a field-by-field basis, redundant wordlines or bitlines in individual memory instances may be pre-tested easily. Also, the redundancy flip-flops can be tested quickly by scanning arbitrary patterns into them. During the override mode, the CLK signal 312, which may be generated from a system clock or a separate clock circuit, is issued 2×K times, where K is the total number of the flip-flops connected in a scan chain (when loading the fuse box, the CLK signal 312 is issued K times and when the contents of the fuse box are scanned out, it is issued K times).

Figure 6A:
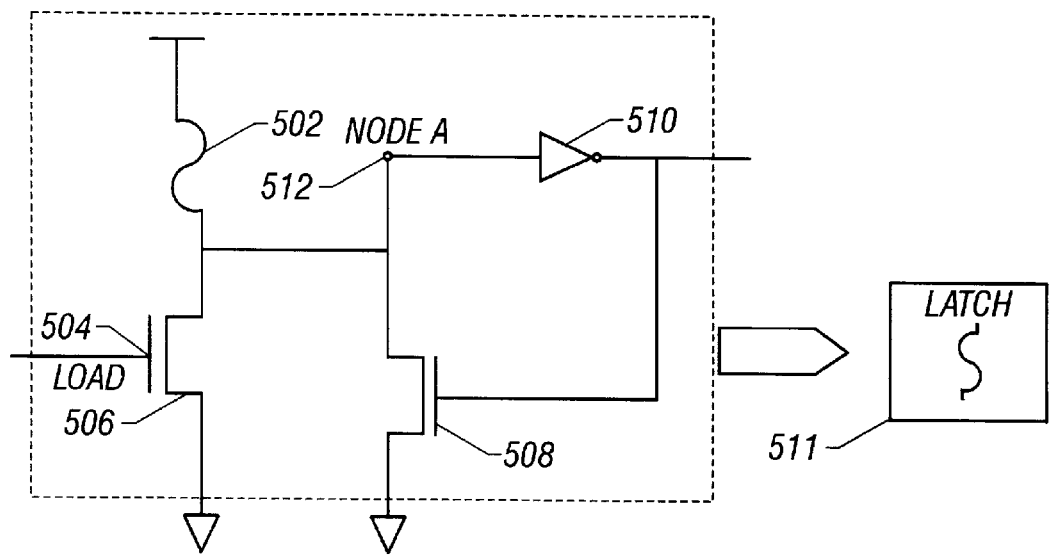
FIG. 6A depicts an exemplary fuse implementation for use with the Fuse Box™ of the present invention.
Figure 6B:
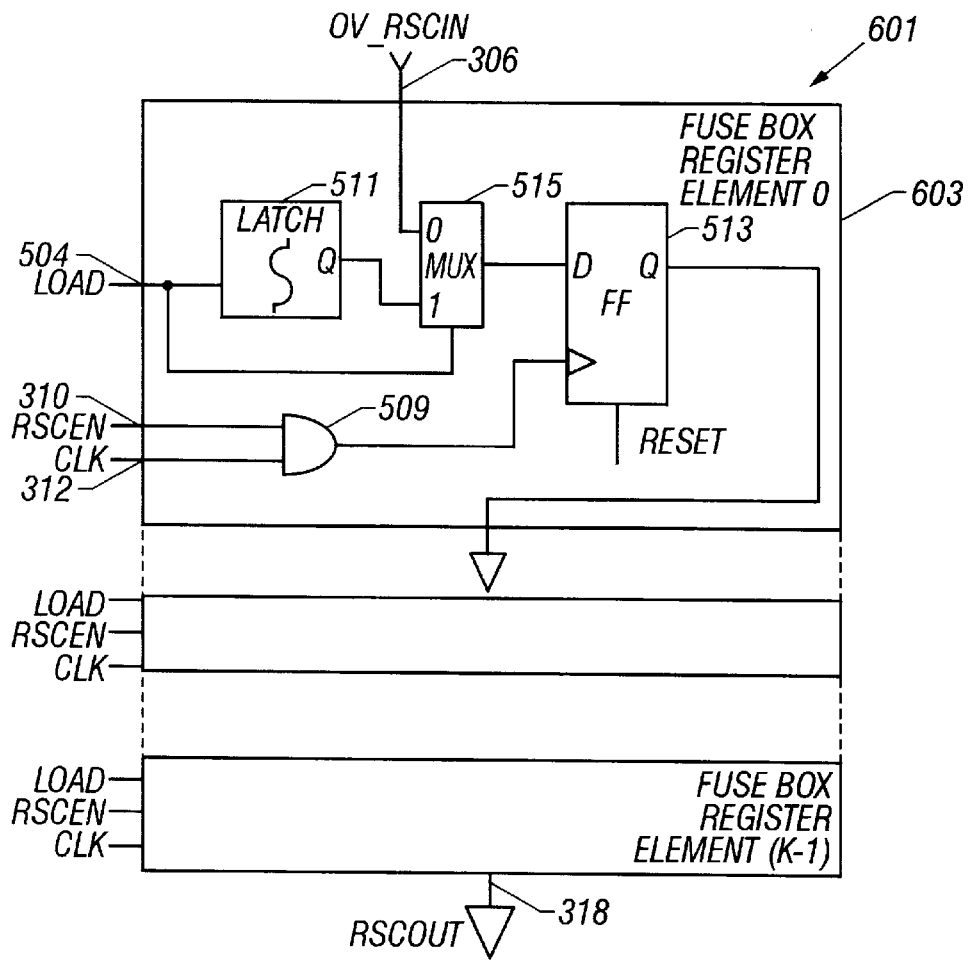
FIG. 6B depicts an exemplary embodiment of a Fuse Box™ register in accordance with the teachings of the present invention.
Figure 7A:
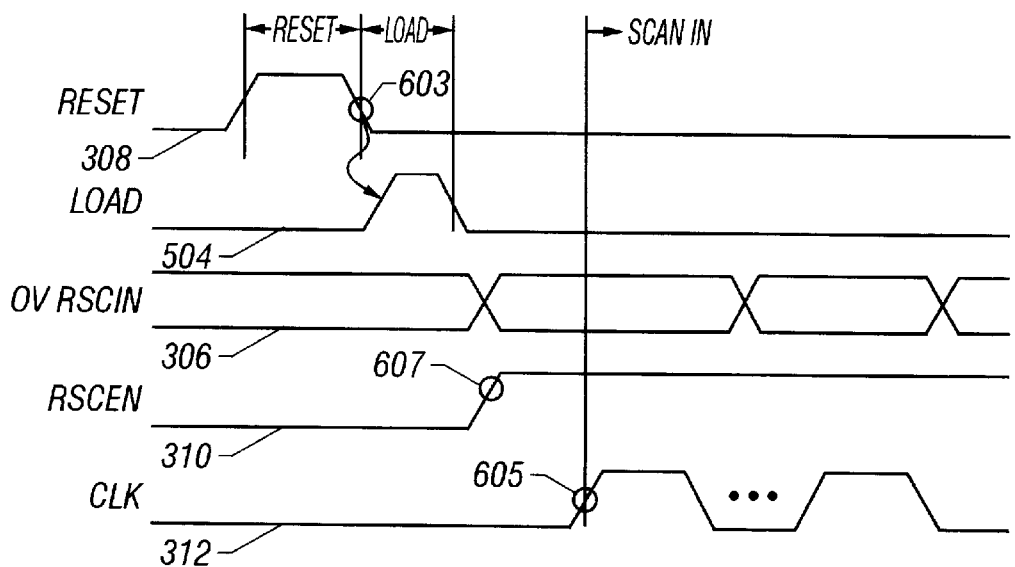
FIG. 7A depicts a timing diagram of the various signals used in the provisioning of redundancy in accordance with the teachings of the present invention.

FIG. 6A depicts an exemplary implementation of a fuse element 502 for effectuating zero quiescent power consumption in the fuse box 206 after the contents therein have been scanned out. Reference numeral 511 refers to an equivalent symbol of the fuse element circuitry. FIG. 6B depicts an exemplary fuse box register arrangement 601 with K register elements provided in accordance herewith. FIG. 7A depicts a timing diagram of the appropriate signals in connection with the redundancy scanning scheme provided herein. When the RESET signal 308 is active, all the flip-flops are reset. A falling edge 603 therein triggers a LOAD pulse 504 which is applied to the gate of a transistor 506 of the fuse element circuitry. If the fuse 502 is blown (i.e., the fuse in the "open" state), the transistor 506 discharges a Node A (reference numeral 512) that is provided as an input to an inverter 510. The output of the inverter 510 is provided to the gate of a transistor 508 disposed in a "half-latch" arrangement therewith. If the fuse is in "closed" state, the Node 512 remains at a power supply level. Preferably, the transistor 506 is sized such that the IR drop across the fuse 502 is minimal. Further, the transistor 506 may be advantageously provided as a weak transistor where hundreds of fuses are employed and the peak current is to be minimized.

Continuing to refer to FIG. 7A, a rising edge 605 in the CLK signal 312 is used for scanning either the fuse contents or override data (available on the OV_RSCIN signal line 306) into redundancy scan flip-flops. A rising edge 607 in the RSCEN signal 310 enables these two scan-out operations.

As shown in FIG. 6B, an individual fuse box register element, e.g., register element 603, comprises a fuse latch 511 and FF 513, for effectuating the operations set forth above. The first register element 603 also includes a 2:1 MUX 515. Those of ordinary skill in the art should readily understand that the 2:1 MUX 515 is provided for selecting either the fuse data in the fuse latch 511 or the override data present on the OV_RSCIN signal line 306 in order to furnish to the D input of the fuse box FF 513. The Q output of the fuse box FF 513 is daisy-chained with the rest of the fuse box FFs in a fashion analogous to a memory instance scan chain described above. Accordingly, the Q output of the $K^{th}$ register element (i.e., element (K–1)) is provided as the RSCOUT signal 318 of the fuse box.

Figures 7B, 8D:
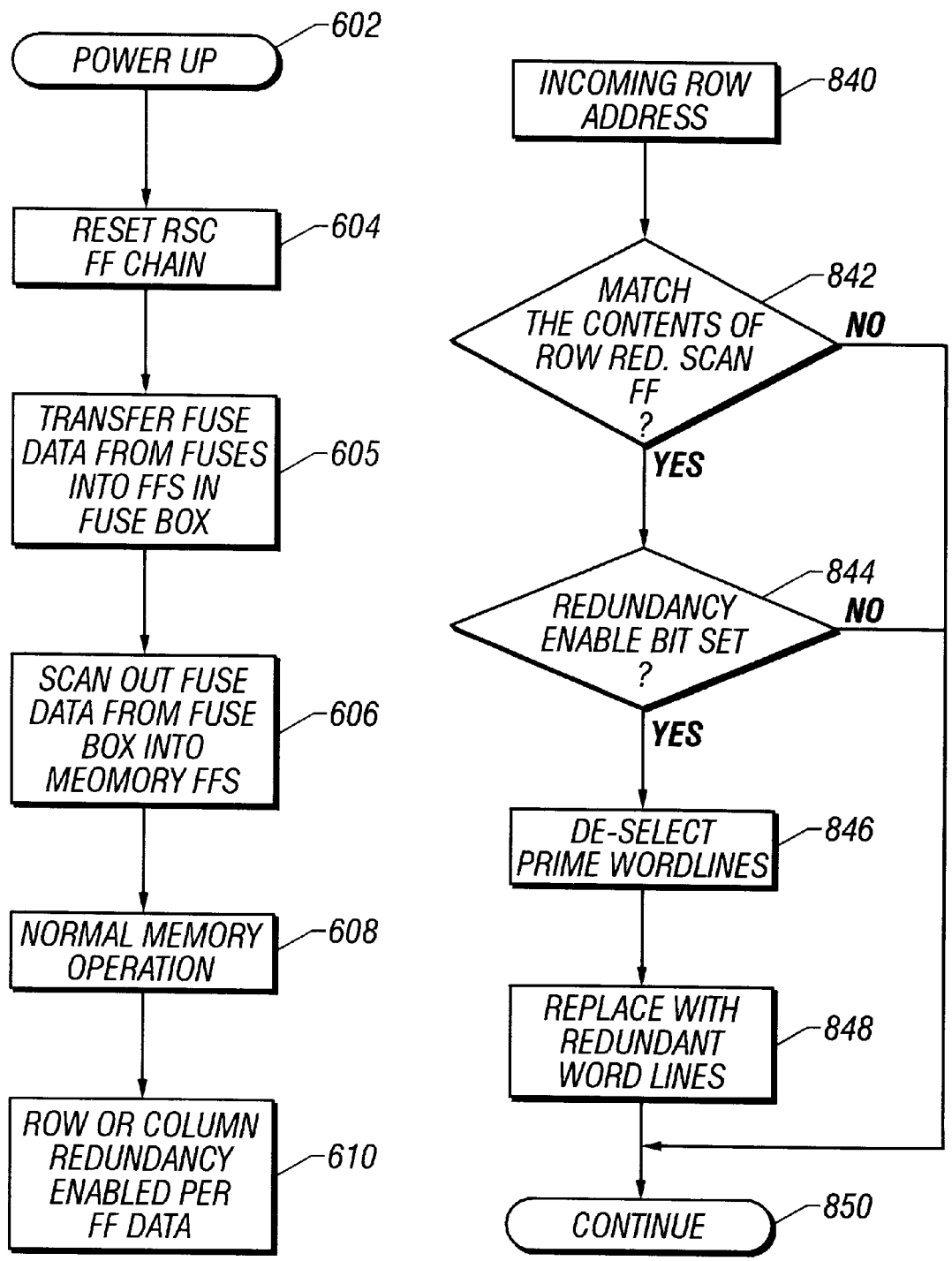
FIG. 7B depicts a flow diagram of the operation of a presently preferred redundancy scheme provided in accordance with the teachings of the present invention.
FIG. 8D illustrates a flow diagram of a presently preferred row redundancy method provided in accordance with the teachings of the present invention.

FIG. 7B depicts a flow diagram that summarizes the steps used in the operation of a presently preferred redundancy scheme provided in accordance with the teachings of the present invention. Upon power-up of the integrated circuit or device embodying the teachings of the present invention (step 602), a reset of all the redundancy flip-flops is effectuated (step 604). Although not explicitly shown herein, a pre-testing operation may be performed in the override mode as described hereinabove. Thereafter, the fuse information/data is stored in the fuses (e.g., by appropriately laser-blowing the fuses) with respect to defective rows and columns as determined upon suitable testing. Subsequently, the fuse data is transferred from the fuses to the FFs in the fuse box (step 605). Thereafter, the data in the fuse box FFs is scanned out into redundancy scan flip-flops in the memory instances using the signals described in the foregoing (step 606). Normal memory operations, for example, read/write operations, etc. (step 608) may be performed thereafter. Depending upon whether a failing row or column is accessed, redundant row/s or column/s in the corresponding memory instance are appropriately enabled (step 610).

Figure 8A:
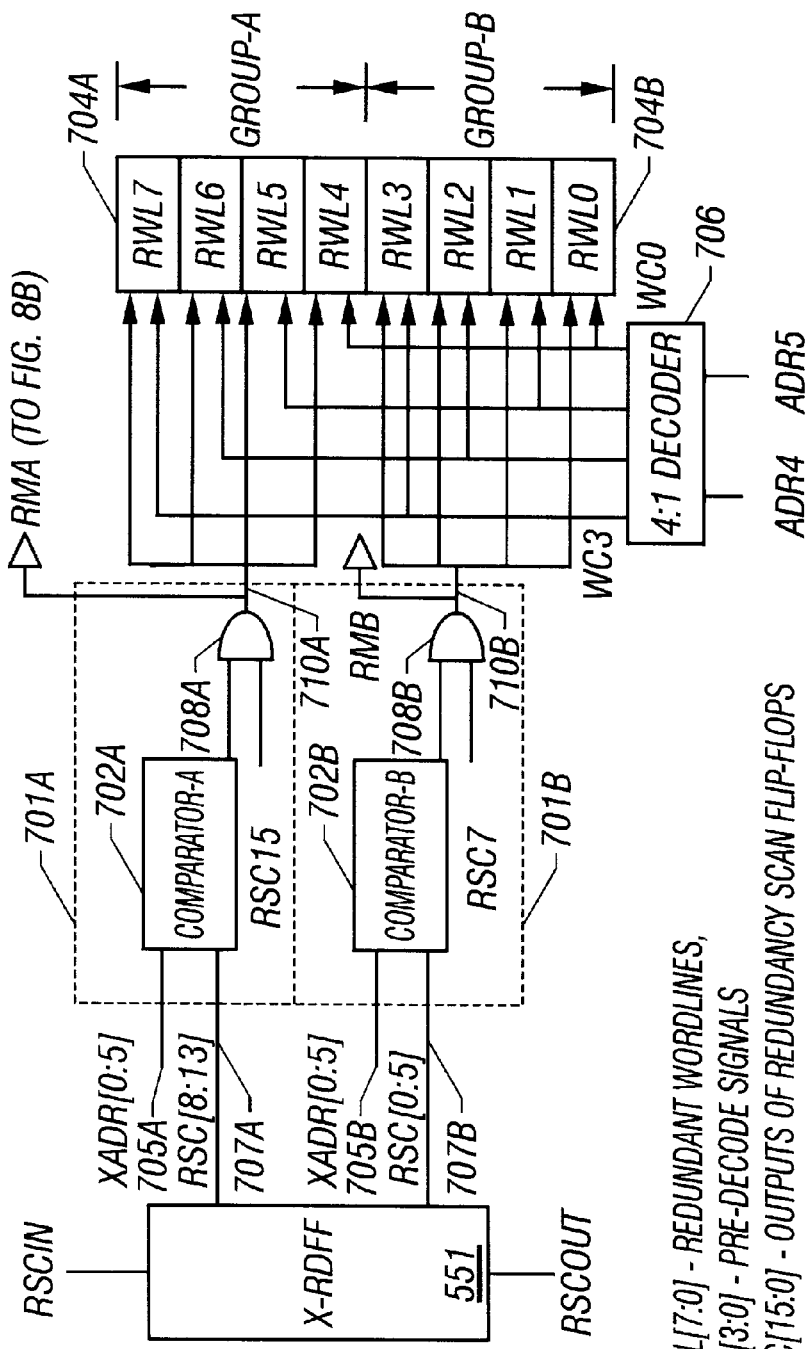
FIG. 8A depicts a functional schematic block diagram of a presently preferred row redundancy scheme for selecting a block of redundant wordlines to replace a corresponding block of faulty wordlines in a memory array.
Figure 8B:
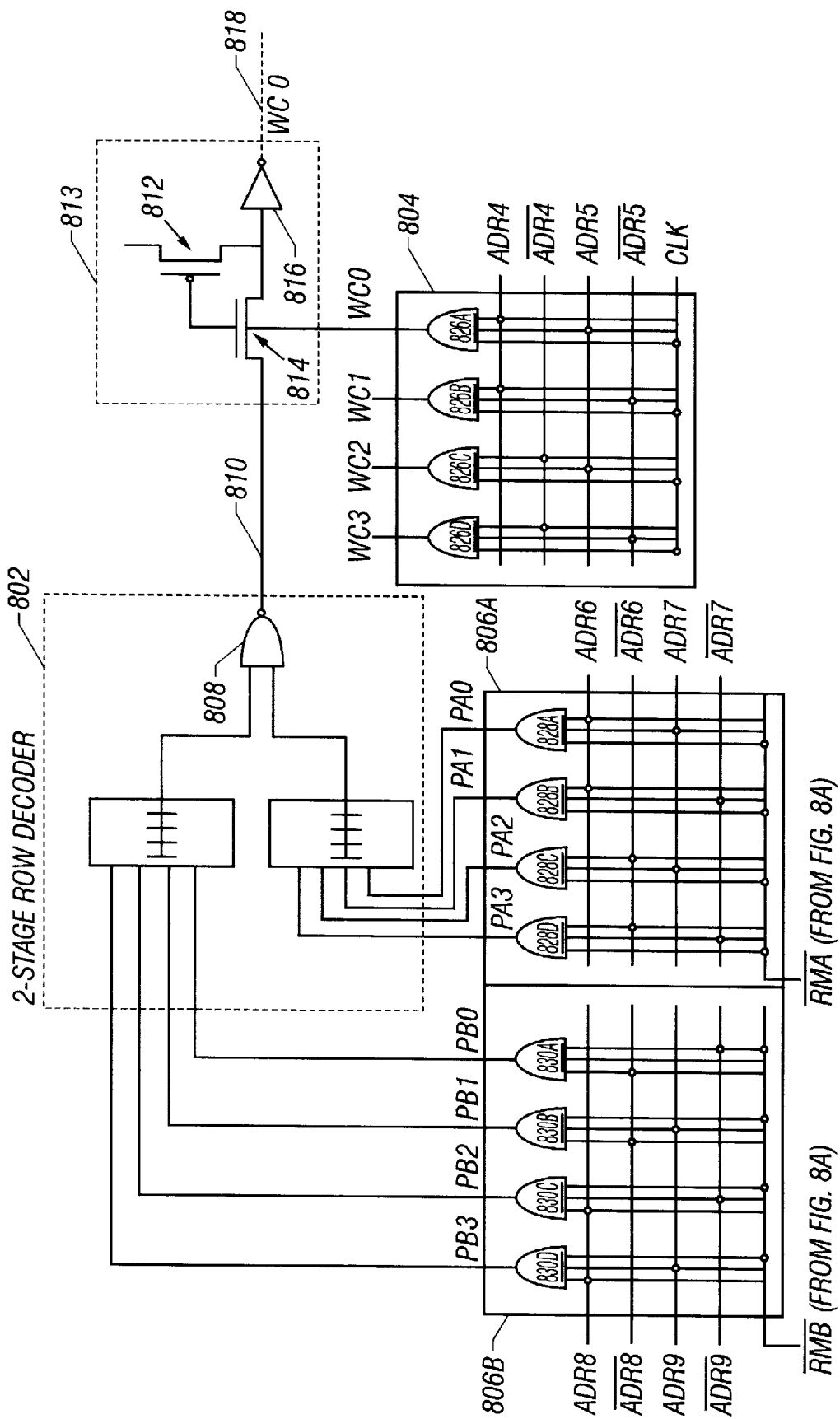
FIG. 8B depicts a functional schematic block diagram of an exemplary scheme for de-selecting or disabling a block of wordlines in a memory array.

Referring now to FIG. 8A, depicted therein is a functional schematic block diagram of a presently preferred exemplary embodiment of a row redundancy scheme for selecting (i.e., enabling) a block of redundant wordlines (RWL0–RWL7, organized into two groups, Group-A 704A and Group-B 704B, of four RWLs each) in a memory instance in accordance with the teachings of the present invention. FIG. 8B depicts a functional schematic block diagram of a simplified scheme for disabling a plurality of faulty wordlines in the main array of the memory instance.

As shown in FIG. 8A, two logic blocks, logic block 701A and logic block 701B, are utilized in selecting between the two groups of RWLs for block replacement of four wordlines in the prime memory array of a memory instance. Each logic block is provided with a plurality of incoming row address signals XADR[0:5] 705A/705B. The row addresses are compared by comparators 702A/702B of the logic blocks 701A/701B with the contents of redundancy scan flip-flops (after the appropriate fuse data has been scanned in). As exemplified, the contents of RSC[8:13] (reference numeral 707A) and RSC[0:5] (reference numeral 707B) are available from a suitable row redundancy scan register associated with the memory instance, e.g., X-RDFF 551 (shown in FIG. 5B), for such comparisons in order to determine if faulty row locations are being accessed.

The output of the comparators 702A/702B is ANDed with a redundancy enable bit (RSC15 or RSC7, which are preferably set at the time of loading the RSC FF scan chain in the memory instance with the fuse box data) by logic gates 708A/708B, respectively, provided in the logic blocks. Accordingly, it should be apparent that the redundancy enable bit (RSC15 or RSC7) must be set in order to enable the RWL groups. The outputs of the logic blocks, Redundancy Match A (RMA) 710A and Redundancy Match B (RMB) 710B, are then combined with outputs (WC[0:3]) from a wordline clock 706 (provided as a 4:1 decoder with ADR4 and ADR5 signals as inputs) in order to enable the appropriate RWLs. In addition, the outputs RMA 710A and RMB 710B are also provided to the circuitry depicted in FIG. 8B for disabling the faulty wordlines in the prime/main memory array.

Referring now to FIG. 8B, a simplified 2-stage row decoder circuit 802 receives outputs PA[0:3] and PB[0:3] from two pre-decoder circuits 806A and 806B. Each pre-decoder circuit is exemplified with four AND gates (reference numerals 828A–828D and 830A–830D). Row address signals ADR6, ADR7, and their complements are provided as inputs to the pre-decoder 806A. Similarly, row address signals ADR8, ADR9, and their complements are provided as inputs to the pre-decoder 806B. In addition, the complements of the RMA 710A and RMB 710B signals from the logic blocks 701A/701B, shown in FIG. 8A, are also provided as inputs to the pre de-coders 806A and 806B, respectively. Accordingly, it should be readily appreciated that when either of the Redundancy Matches is HIGH (that is at least one redundancy enable bit is set), either RMA or RMB is asserted LOW, thereby pulling the pre-decoder outputs (either PA[0:3] or PB[0:3]) to a logic LOW also. In the exemplary embodiment shown herein, the logic of the 2-stage row decoder 802 is implemented such that when the pre-decoder outputs are LOW, output 810 of logic gate 808 is driven HIGH.

A clocked 4:1 WC decoder 804 is used in this exemplary row disabling scheme for controlling wordline logic 813 disposed between the wordline WL0 818 and the output stage of the row decoder 802. The WC decoder 804 is exemplified as a circuit comprising four 3-input AND gates (826A–826D) which receive ADR4, ADR5, and their complements, in addition to the CLK signal. Each of the WC[0:3] outputs from the clocked WC decoder 804 is provided to the corresponding wordline logic block 813 comprised of a pass transistor 814, a pull-up transistor 812 and an inverter 816.

In general operation of the row de-selecting scheme described above, when a Redundancy Match is found after the comparators 701A/701B in FIG. 8A have completed the address comparison, the output of the row decoder 802 is driven HIGH. This logic state is passed to the input of the inverter 816 by appropriately turning on the pass transistor 814 and turning off the pull-up transistor 812, as effectuated by a corresponding WC output gated by the rising edge of the CLK signal. Accordingly, the logic state of WL0 is driven LOW thereby de-selecting that wordline in the main array.

It should be appreciated that two groups of RWLs are provided in the presently preferred exemplary row redundancy scheme in order to repair any arbitrary row defects including row-to-row shorts across a pre-decode boundary. Also, redundancy is effectuated in groups of four rows to minimize the speed impact due to adding redundancy circuitry. By replacing a group of four rows at once, 4:1 address decoders can be advantageously used instead of 2:1 address decoders. Since the two least significant bits (LSBs) of row-addresses do not require to be compared, the speed of address comparison and CLK-to-Q delay are improved thereby.

Figure 8C:
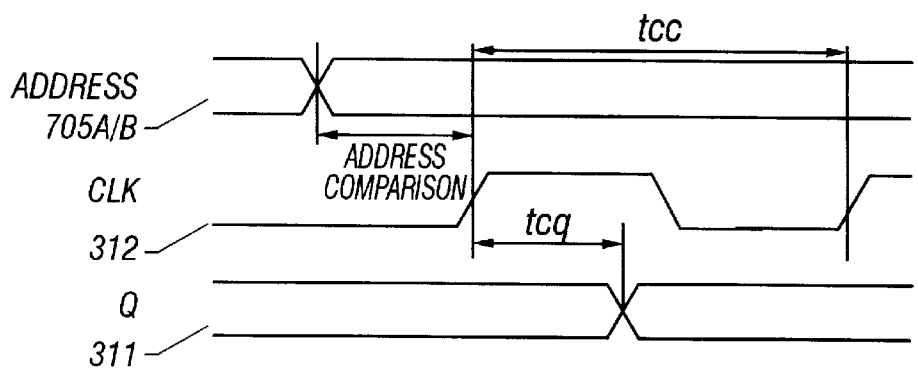
FIG. 8C depicts a timing diagram for the row address, CLK, and Q signals with respect to the row redundancy scheme of the present invention.

Furthermore, as depicted in the timing diagram of FIG. 8C, address comparison is preferably performed before the rising edge of the CLK signal so that there is little impact on the cycle time ($t_{cc}$) and the CLK-to-Q delay (i.e., access time, $t_{cq}$). Whereas there may be a small increase in the set-up time because of the address comparison time, it should be appreciated by those skilled in the art that such increase is of no significant consequence with respect to the performance of the semiconductor device.

FIG. 8D depicts a flow diagram of a presently preferred row redundancy method provided in accordance with hereinabove. After receiving an incoming row address (step 840), a comparison is made between the address and the contents of the redundancy scan flip-flops provided in a memory instance to determine if there is a match (decision block 842). If a match is found, another determination is made to verify if the redundancy enable bit is set (decision block 844). If so, wordlines in the main array of the memory instance, as decoded from the appropriate row address signals, are de-selected (step 846). In conjunction therewith, a block of redundant wordlines are accessed in lieu of the de-selected main memory wordlines (step 848). Normal memory operations ensue thereafter (step 850) which may include additional redundancy-related procedures.

Figure 9:
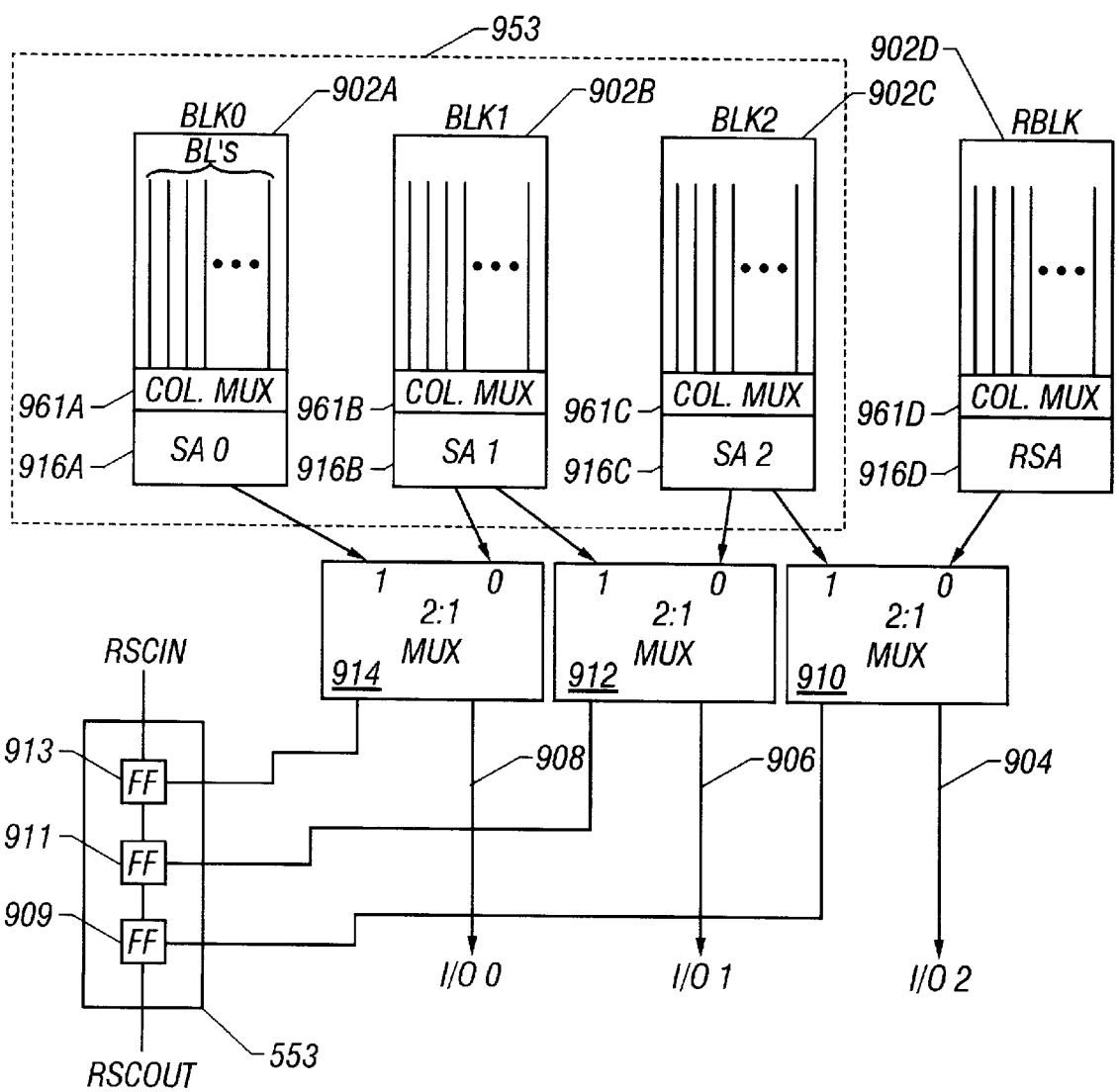
FIG. 9 depicts a functional schematic block diagram of a column redundancy scheme for replacing a block of bitlines with a redundant block in accordance with the teachings of the present invention.

Referring now to FIG. 9, depicted therein is a functional schematic block diagram of a column redundancy scheme for replacing a block of columns (i.e., bitlines) with a redundant block in accordance with the teachings of the present invention. An exemplary primary memory 953 is organized into three blocks of columns, BLK0 902A, BLK1 902B and BLK2 902C, each of which is provided with a plurality of bitlines (BLs), a column MUX and a sense amplifier (SA). Accordingly, SA0 916A and COL MUX 961A, SA1 916B and COL MUX 961B, and SA2 916C and COL MUX 961C are provided with BLK0, BLK1 and BLK2, respectively. A redundant block of columns, RBLK 902D, and associated sense amplifier RSA 916D and COL MUX 961D are provided for redundancy.

A plurality of 2:1 MUXs (where the number of MUXs is provided to be one less than the total number of column blocks including the RBLK block) are disposed between the outputs of SAs (RSA included) and the three outputs I/O2 904, I/O1 906 and I/O0 908. Three MUXs 910, 912 and 914 are exemplified herein. On the input side, each MUX is coupled to two adjacent SA outputs, including the RSA output. Accordingly, for example, the SA0 and SA1 outputs are provided as the two inputs to MUX 914. Similarly, the SA1 and SA2 outputs are provided to MUX 912, and the SA2 and RSA outputs are provided to MUX 910. On the output side, MUX 914 is coupled to I/O0 908, MUX 912 is coupled to I/O1 906, and MUX 910 is coupled to I/O2 904.

In accordance with the teachings of the present invention, each 2:1 MUX is associated with a 1-bit register preferably provided as a redundancy scan flip-flop (e.g., FF 913, FF 911, or FF 909) in a suitable column redundancy scan register (e.g., Y-RDFF portion 553 shown in FIG. 5B) associated with the memory instance. As explained in detail hereinabove, the contents of the redundancy flip-flops in turn are scanned in from the fuse elements of the fuse box 206. The output of the redundancy scan flip-flop is used as a MUX control input for steering one of the SA inputs of the 2:1 MUX to its output. For example, if a "1" is loaded in FF 913, the MUX 914 output (i.e., I/O0 908) is coupled to SA0. On the other hand, if a "0" is loaded in FF 913, SA1 is steered to the output. Accordingly, it should be realized by those of ordinary skill in the art upon reference hereto that by properly loading the flip-flops, any three of the four column blocks (including the RBLK 902D) may be selected, thereby leaving out the one faulty block.

For example, assume that BLK1 902B is tested to be faulty. The appropriate fuse data to effectuate column redundancy is [1][0][0]. That is, FF 913 is loaded with "1" (steering SA0 to the output 908); FF 911 is loaded with "0" (steering SA2 to the output 906); and FF 909 is loaded with "0" (steering RSA to the output 904). It can be seen that the faulty block's SA1 output is avoided advantageously in this scheme.

In a presently preferred exemplary embodiment of the output-based column redundancy scheme set forth above, a total of forty one blocks are provided, each block having 16 columns. The 41$^{st}$ block, BLK40, is provided as the redundant block. Also, forty SA outputs (SA0 through SA39) and one RSA output are provided in connection therewith. Since there are 41 total blocks, forty 2:1 MUXs are disposed between the forty outputs (Q0/D0 through Q39/D39) and the SAs. To properly steer the SA outputs via the MUXs in accordance with the teachings of the present invention, forty redundancy scan flip-flops (whose outputs are denoted by RSC15 through RSC54) are provided. The contents of the fuse box corresponding to these flip-flops are determined after suitable testing of the memory instance. Thereafter, by scanning out the fuse data into RSC flip-flops of the Y-RDFF portion, appropriate blocks (forty out of forty one blocks) are advantageously selected.

It should be apparent that the selection/de-selection of column blocks described hereinabove is based on steering the appropriate SA output to a corresponding MUX output. Accordingly, the column-based redundancy scheme disclosed herein may also be termed as the "output-based" redundancy scheme.

Figure 10A:
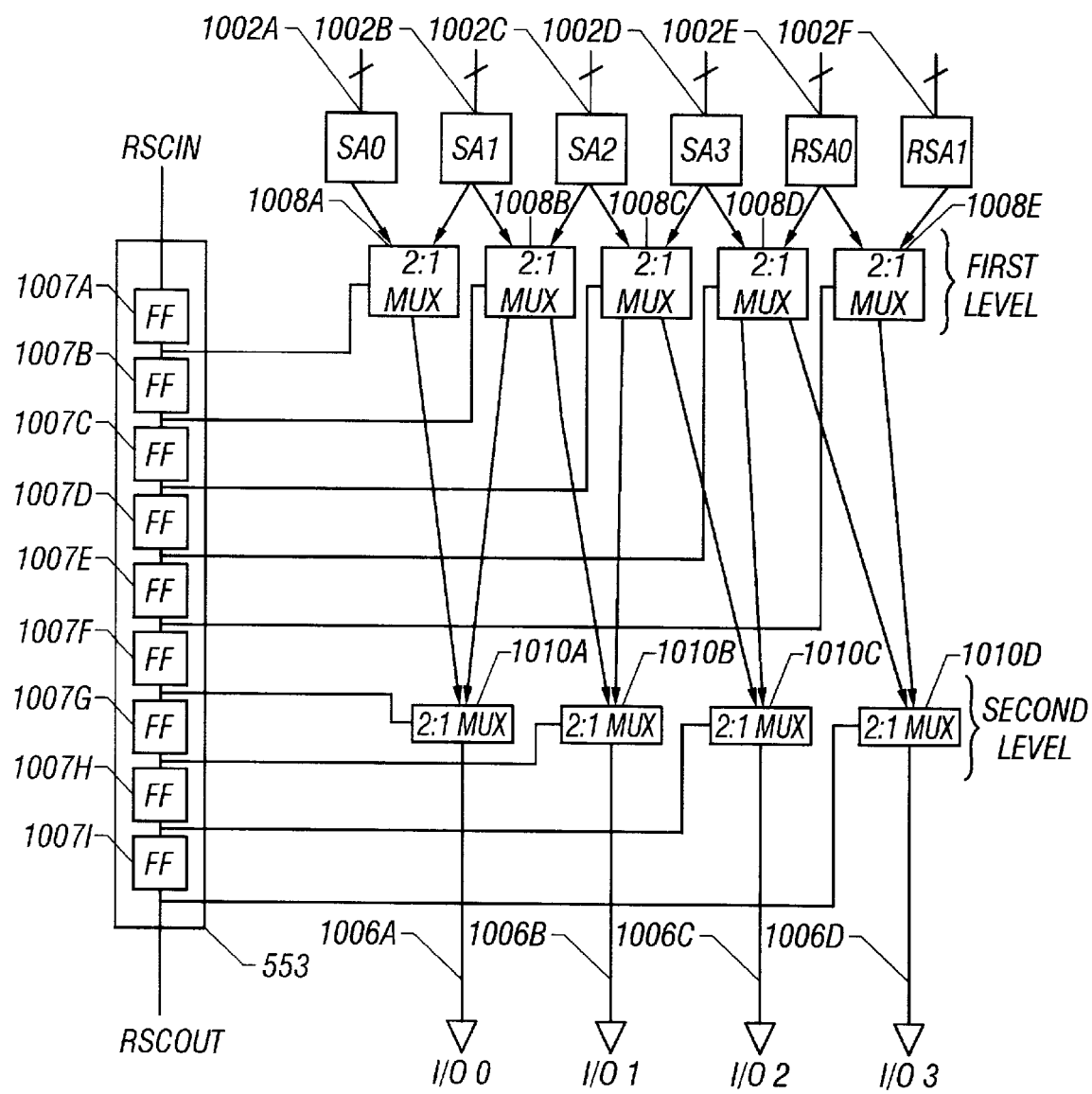
FIG. 10A illustrates an exemplary embodiment of a multiple column redundancy scheme.
Figure 10B:
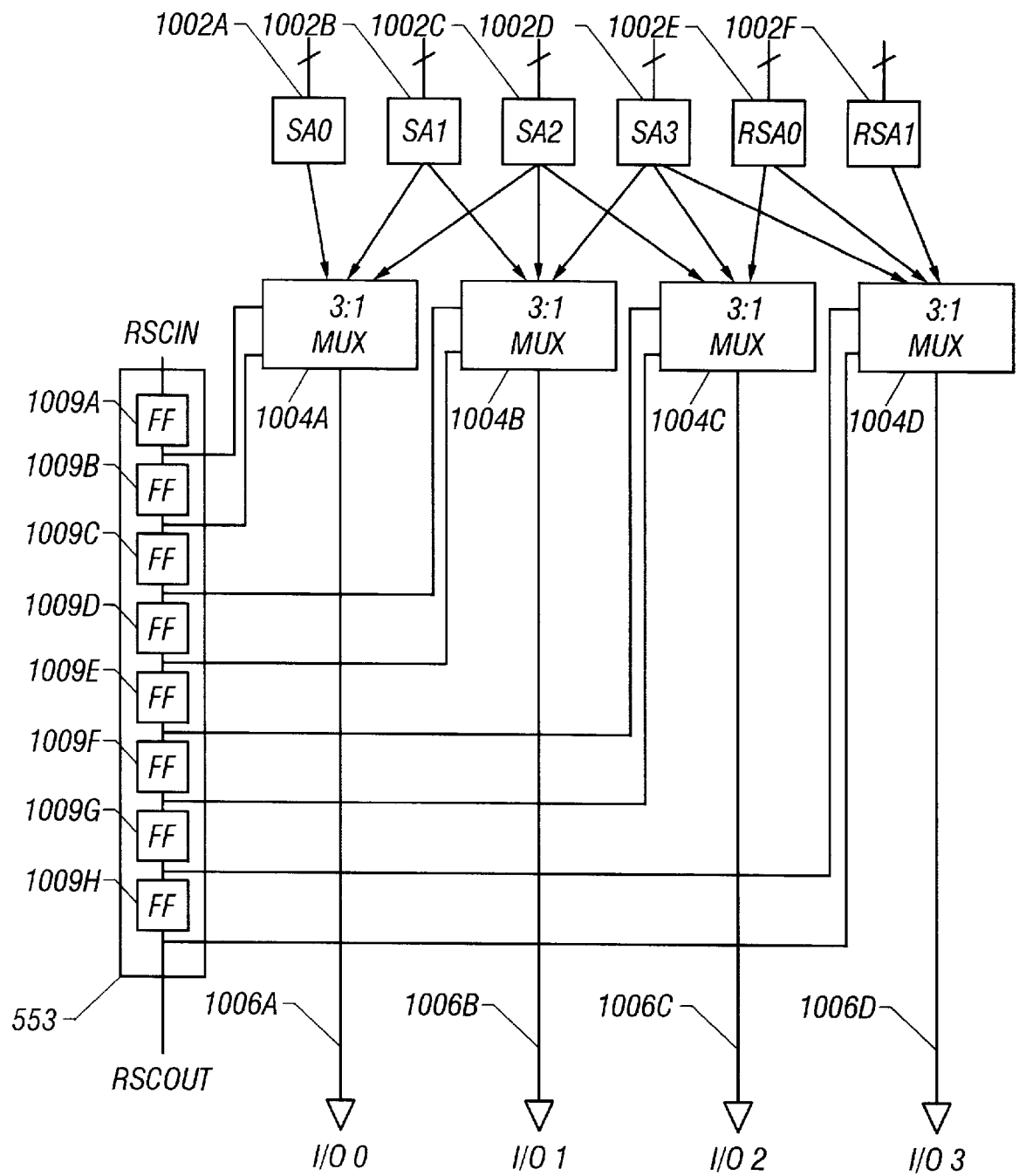
FIG. 10B illustrates another exemplary embodiment of a multiple column redundancy scheme.

FIGS. 10A and 10B depict two exemplary schemes for selecting an arbitrary number (e.g., N) of redundant column blocks in order to replace an equal number of faulty primary column blocks in accordance with the teachings of the present invention. The scheme provided in FIG. 10A operates by adding extra layers of 2:1 MUXs for successively steering the SA outputs, their multiplexed outputs, and so on, to the respective I/O paths. In the exemplary scheme, four outputs are illustrated: I/O0 1006A, I/O1 1006B, I/O2 1006C, and I/O3 1006D. Two redundant column blocks, RSA0 1002E and RSA1 1002F, are provided for repairing/replacing up to two of the four primary column blocks, shown with their respective SAs: SA0 1002A, SA1 1002B, SA2 1002C, and SA3 1002D. It should be appreciated that for the sake of simplicity, the multiple bitlines and column MUXs of the respective column blocks are not explicitly illustrated herein.

A first level 2:1 MUX arrangement comprising five MUXs (reference numerals 1008A through 1008E) is used for steering the outputs of all SAs (including those associated with the two redundancy SAs) to the appropriate MUX outputs based on the contents of a suitable sub-section of the Y-RDFF portion 553 of the memory instance. As there are five 2:1 MUXs in the first level MUX arrangement, the contents of five FFs (reference numerals 1007A through 1007E) are accordingly utilized for appropriately steering the SA outputs in a manner described in detail hereinabove with respect to the single column block redundancy scheme.

In accordance herewith, a second level 2:1 MUX arrangement, comprising four MUXs (reference numerals 1010A through 1010D), is provided for steering the outputs of the first level MUXs to suitable I/Os. Another sub-section of the Y-RDFF portion 553 , comprising FF 1007F through FF 10071, is used for proper output steering.

Those of ordinary skill in the art should readily understand upon reference hereto that by adding, N levels of 2:1 MUXs in accordance with the teachings herein, N defective column blocks may be advantageously replaced by a corresponding number of redundant blocks. Also, the number of FFs required may be computed as $\Sigma(P-K)$; where P=the total number of SAs, and K→1 to N.

Referring now to FIG. 10B, the same four-I/O instance described above is exemplified herein also for the sake of illustration. Instead of multiple levels of 2:1 MLIX arrangements, a single level of 3:1 MUIX arrangement (having four such MUXs, reference numerals 1004A through 1004D) is provided for steering the SA outputs to appropriate I/O path. Each 3:1 MUX is provided with three SA inputs, one of which is steered to the corresponding I/O based on the contents of a two-FF sub-portion from the Y-RDFF portion 553. For example, MUX 1004A receives SA0 1002A, SA1 1002B and SA2 1002C as its inputs, and its output (coupled to I/O0 1006A) is determined depending upon the contents of FF 1009A and FF 1009B. Accordingly, in this exemplary embodiment, a total of eight FFs are shown in the Y-RDFF portion 553 for properly steering the SAs, including the two redundancy SAs, RSA0 1002E and RSA1 1002F. Those of ordinary skill in the art should realize that this single MUX level scheme is scalable for repairing/replacing arbitrary N defect column blocks by providing a plurality of (N+1): 1MUXs, equal to the number of I/Os. Also, the total number of FFs required may be computed as $[INT\{\log_2(N-1)\}.(P-1)]$, where P is the number of SAs.

It should be realized that the output-based column redundancy scheme of the present invention (regardless of the number of redundant blocks involved) has several benefits such as, for example, requiring no address comparators and having very small area overhead. Accordingly, the speed penalty is very minimal. Also, it should be appreciated that the design is very robust since multiplexing is done after the sense amplifier stage. Furthermore, the ease and simplicity of the scheme which operates on a full output replacement mode renders it very compiler-friendly.

Figure 11A:
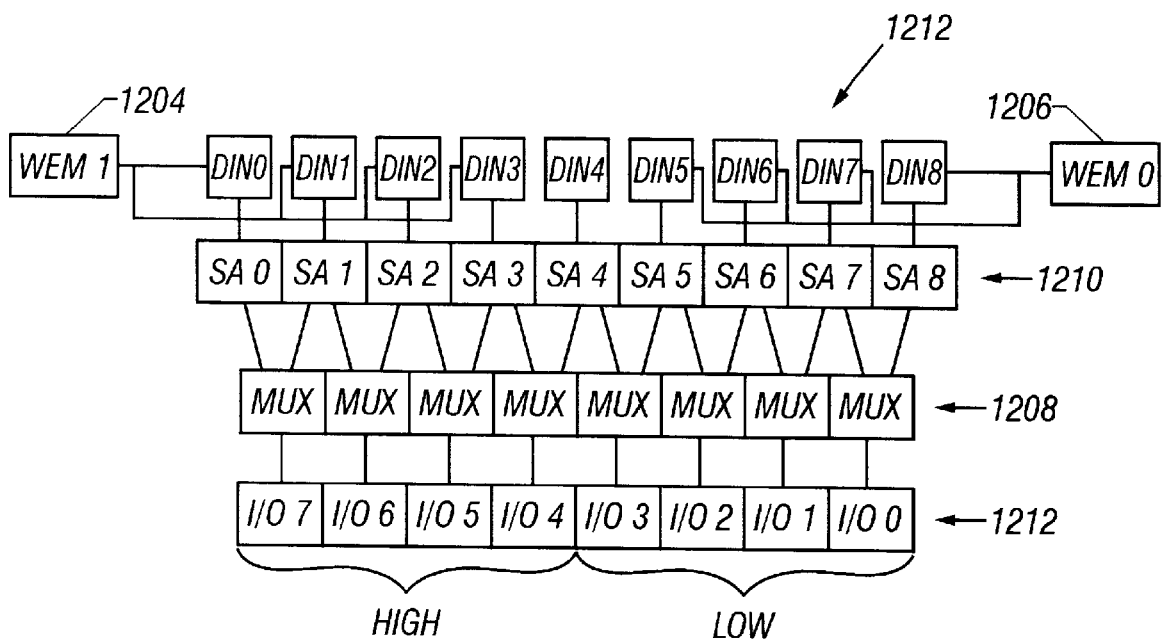
FIGS. 11A and 11B depict an exemplary subword access scheme for writing into a memory using a partial portion of its I/O.
Figure 11B:
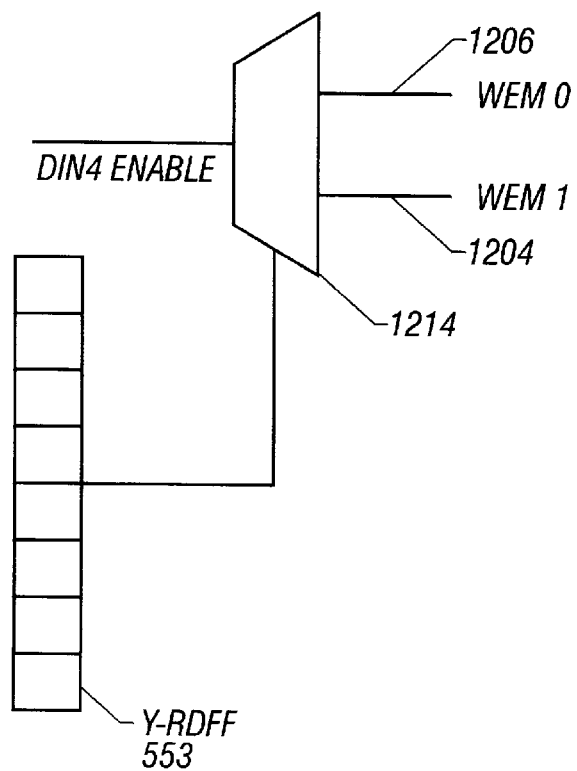

FIGS. 11A and 11B depict an exemplary subword access scheme for writing into a memory via a subset of an I/O 1212, wherein the memory instance is provided with an output-based column redundancy in accordance with the teachings of the present invention. A byte-wide I/O is exemplified herein. Also, by way of example, a nibble-wide write access (a HIGH nibble or a LOW nibble) is depicted. Each I/O is provided with a 2:1 MUX as per the column redundancy scheme set forth hereinabove. Also, a total of nine SAs (SA0 through SA8) are provided, each of which is coupled to a write column MUX (not shown) associated with a particular column block (including the redundant block).

A plurality of Data In Drivers (DIN0 through DIN8, collectively denoted by reference numeral 1212), each of which is associated with a corresponding SA, are provided for writing data into appropriate column blocks. DIN0 through DIN3 are controlled by a Write Enable Mask (WEM1) 1204, so as to effectuate a nibble-wide write. Similarly, DIN5 through DIN8 are controlled by another WEM, WEM0 1206, for effectuating a nibble-wide write also. When the data is written using only a portion of the byte-wide I/O (i.e., either the HIGH or LOW nibble), a boundary condition exists with respect to SA4. This is so because SA4 is MUXed to either I/O4 (i.e., HIGH nibble) or I/O3 (LOW nibble), depending on the setting of the Y-RDFF portion that controls the 2:1 MUXs in accordance with the column redundancy scheme of the present invention. Accordingly, the associated DIN, that is, DIN4, of SA4, needs to be suitably controlled to write the data into either a HIGH nibble column or a LOW nibble column.

FIG. 11B depicts the use of the Y-RDFF scan register setting for determining whether WEM1 1204 or WEM0 1206 controls DIN4associated with SA4. A 2:1 MUX 1214 is utilized wherein the WEMs provide the inputs and the MUX output is provided as a DIN4 Enable signal. Depending on the scan register setting (i.e., whether SA4 is MUXed to I/O3 or I/O4) which provides the control signal for the 2:1 MUX 1214, WEM0 or WEM1 is appropriately provided as the DIN4 Enable signal for writing into the memory as either the LOW or HIGH nibble column. Accordingly, the nibble-wide writes are appropriately effectuated in a memory instance having the output-based column redundancy scheme of the present invention.

Based on the foregoing, it should be appreciated that the present invention provides a redundancy scheme that advantageously overcomes the deficiencies and shortcomings of the prior art in terms of: (i) efficient layout; (ii) compiler-friendliness; and (iii) throughput of fuse processing. Since fuses are typically provided as top-level structures which completely block other signals and power lines, it is very difficult to lay out fuses and integrate with the rest of sub-blocks of a memory instance in conventional redundancy schemes. Clearly, such approaches result in inefficient layouts in terms of area and quality (because creating power grids may not be feasible).

Figure 12:
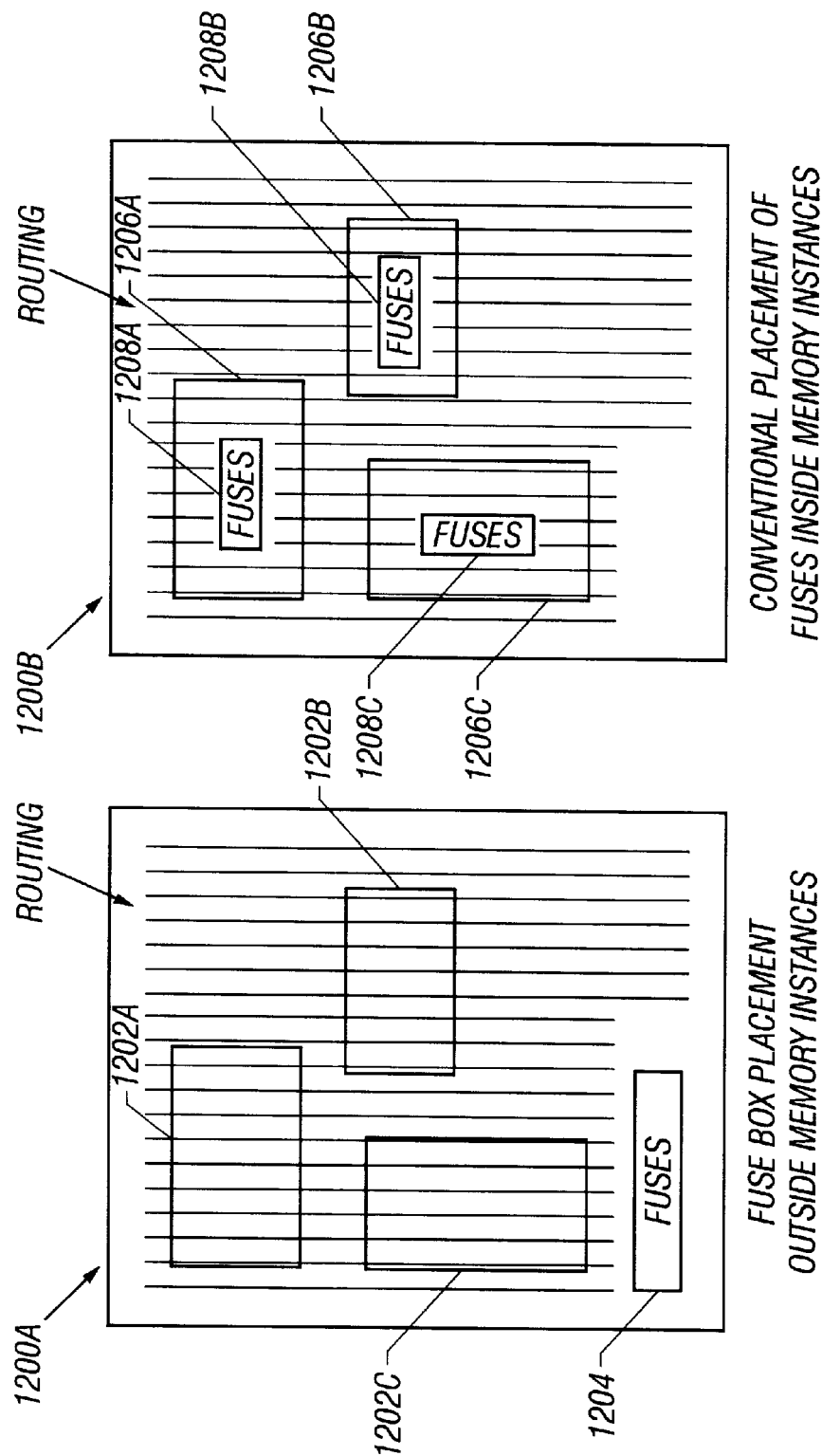
FIG. 12 illustrates the present invention's advantage with respect to routing in a semiconductor memory device.

Also, the present invention provides the advantage of efficient routing with respect to embedded, multi-instance semiconductor devices. By way of example, FIG. 12 illustrates two semiconductor devices, a conventional device 1200B and one provided in accordance with the teachings of the present invention, device 1200A. Three memory instances, 1202A–1202C, are exemplified in the device 1200A, wherein by removing fuses (which block routing) from inside of the memory instances and placing them as a fuse box 1204 in an area, e.g., a corner, routing is not deleteriously impacted. Accordingly, an area-efficient (i.e., very compact) memory core is advantageously achieved. On the other hand, in the conventional device 1200B, each of the three memory instances (1206A through 1206A) is provided with fuses inside the array (for example, fuses 1208A are disposed in the memory 1206A, etc.). Accordingly, the fuse areas within the memory instances block the routing over them, causing routing congestion thereby. It should therefore be appreciated that the present invention overcomes the routing congestion and related "place and route" problems prevalent in conventional fuse arrangements.

In addition, because of the routing advantages set forth above, the present invention makes it possible to lay out of multi-level power grids. Thus, IR drops within the circuitry are advantageously minimized and current density through power lines is reduced.

Further, as set forth hereinbefore, in the existing solutions it is very difficult to tile fuses and connect fuses to periphery layouts because of the pitch mis-match between the row-decoder fuses and memory core cells. Conventional redundancy schemes, therefore, may require a substantial area of routing channels. On the other hand, the present invention allows a design paradigm where an arbitrary number of fuses can be tiled and connected very easily by means of scalable compilers.

Moreover, in the manufacture of semiconductor devices having fuses, it is desirable to orient the fuses in a single axis so that they can be efficiently fabricated. In addition, by placing the fuses in one location (e.g., a centrally placed location), throughput of blowing fuses is substantially improved, thereby reducing the cost of manufacturing chips. The present invention advantageously provides for such fuse placement.

Furthermore, because the fuse box and memory instances are connected in a daisy chain in accordance with the teachings of the present invention, typically only one global line is needed between the fuse box and a memory instance, and between instances. It should be readily appreciated that the present invention substantially reduces the number of global lines needed for a particular semiconductor device. Clearly, such an advantage is more particularly beneficial in integrating multi-embedded memory instances in a SOC device because of the reduction of routing overhead. The daisy-chain arrangement among the fuses and redundancy scan flip-flops allows individual fuse contents to be read out by easy scanning. Also, relatedly, fuses and redundancy scan flip-flops can be easily tested.

Additionally, it is believed that the operation and construction of the present invention will be apparent from the foregoing Detailed Description. While the method and system shown and described have been characterized as being preferred, it should be readily understood that various changes and modifications could be made therein without departing from the scope of the present invention as set forth in the following claims. For example, although the presently preferred exemplary embodiments of the present invention have been described with block replacement of redundant wordlines and column blocks, it should be realized that the redundancy scheme of the present invention may be practiced with single redundant wordlines and bitlines, and numerous permutations/combinations thereof. Also, the teachings of the present invention are applicable to any type of memory, heretofore known and unknown, that implements redundancy. Furthermore, although laser fuses have been exemplified in the present patent application, the teachings herein are applicable to a variety of fuses such as, for example, non-volatile memory fuses, electrical fuses, et cetera. Accordingly, it should be clearly understood that these and other numerous variations, substitutions, additions, rearrangements and modifications are contemplated to be within the ambit of the present invention whose scope is solely limited by the claims set forth below.

What is claimed is:

1. An integrated semiconductor device, comprising:
   a plurality of memory instances embedded in said integrated semiconductor device's circuitry, wherein at least one of said plurality of memory instances comprises a prime memory array and a redundant memory portion;
   a volatile scan register disposed in said at least one of said plurality of memory instances, said volatile scan register including a plurality of concatenated flip-flops;
   a fuse box register disposed external to said plurality of memory instances in a selected area of said integrated semiconductor device, said fuse box register including a plurality of fuses for storing fuse information, each fuse being in either an open or closed state, wherein said fuse information is associated with location data pertaining to a faulty portion in said prime memory array; and
   means for transferring said fuse information to said volatile scan register from said fuse box register upon a reset of said integrated semiconductor device,
   wherein said fuse information in said volatile scan register is used for replacing said faulty portion in said prime memory array with at least a part of said redundant memory portion.

2. The integrated semiconductor device as set forth in claim 1, wherein said faulty portion includes a faulty wordline and a portion of said volatile scan register stores an address of said faulty wordline provided from said fuse box register, and further wherein said scan register is coupled to a comparator provided for comparing a row address with said address of said faulty wordline, said comparator generating a control signal for effectuating a replacement of said faulty wordline with a redundant wordline in said redundant memory portion when there is a match between said row address and said address of said faulty wordline.

3. The integrated semiconductor device as set forth in claim 1, further including a plurality of 2:1 multiplexers, the output of each of which is provided to a corresponding I/O block of said at least one memory instance, each 2:1 multiplexer receiving inputs from two sense amplifiers which are coupled to adjacent column blocks, including a redundant column block provided in said redundant portion, wherein said faulty portion includes a faulty column block in said prime memory array, and further wherein the contents of said volatile scan register are scanned in from said fuse box register, each flip-flop in said scan register providing a control signal to a corresponding 2:1 multiplexer for steering one of said two sense amplifiers to the output of said 2:1 multiplexer.

4. The integrated semiconductor device as set forth in claim 3, further comprising:
   a plurality of Data In Drivers (DINs), each of which effectuates writing of data into a corresponding I/O block of said at least one memory instance;
   a first Write Enable Mask (WEM) generator to produce a first WEM signal that selectively activates a first portion of said plurality of DINs such that data is written into a corresponding first portion of the I/O blocks;
   a second WEM generator to produce a second WEM signal that selectively activates a second portion of said plurality of DINs such that data is written into a corresponding second portion of the I/O blocks; and
   a 2:1 MUX coupled to said first and second WEM generators, said 2:1 MUX for generating an enable signal corresponding to one of said first WEM and second WEM signals, said enable signal being provided to a DIN that corresponds to a sense amplifier that is multiplexed to either said first portion or said second portion of the I/O blocks depending on the contents of said volatile scan register, said 2:1 MUX being controlled by one of its flip-flops.

5. The integrated semiconductor device as set forth in claim 1, wherein more than two instances of said plurality of memory instances comprise a prime memory array and a redundant memory portion each, said more than two instances being daisy-chained with said fuse box register.

6. The integrated semiconductor device as set forth in claim 1, wherein said at least one of said plurality of memory instances comprises a Dynamic Random Access Memory (DRAM) circuit.

7. The integrated semiconductor device as set forth in claim 1, wherein said at least one of said plurality of memory instances comprises a Static Random Access Memory (SRAM) circuit.

8. The integrated semiconductor device as set forth in claim 1, wherein said at least one of said plurality of memory instances comprises an Electrically Programmable Read-Only Memory (EPROM) circuit.

9. The integrated semiconductor device as set forth in claim 1, wherein said at least one of said plurality of memory instances comprises a Flash EPROM circuit.

10. The integrated semiconductor device as set forth in claim 1, further including means for replacing an arbitrary number (N) of faulty column blocks in said prime memory array using an equal number of column blocks provided in said redundant portion.

11. The integrated semiconductor device as set forth in claim 10, wherein said means for replacing an arbitrary number (N) of faulty column blocks in said prime memory array comprises N levels of 2:1 multiplexers controlled by the contents of a column redundancy scan register portion provided in said volatile register, each level including a number of 2:1 multiplexers that is one less than the number of 2:1 multiplexers provided in an immediately preceding level.

12. The integrated semiconductor device as set forth in claim 10, wherein said means for replacing an arbitrary number (N) of faulty column blocks in said prime memory array comprises a plurality of (N+1):1 multiplexers, the output of each of which is provided to a corresponding column I/O of said at least one memory instance, said (N+1):1 multiplexers being controlled by the contents of a column redundancy scan register portion provided in said volatile register.

13. The integrated semiconductor device as set forth in claim 1, further including means for loading override fuse information into a plurality of flip-flops provided with said fuse box register, wherein said override fuse information is provided for pre-testing said redundant portion of said at least one memory instance.

14. A memory compiler for use with designing an integrated semiconductor device, said device having a plurality of embedded memory instances, wherein at least one of said plurality of embedded memory instances includes a redundant portion, comprising:

a memory macro cell associated with said plurality of embedded memory instances;

a fuse box register having a plurality of fuses for storing fuse data in order to effectuate a replacement of a faulty memory portion in said at least one of said plurality of embedded memory instances with said redundant portion, said fuse box register being located outside said memory macro cell; and a plurality of redundancy scan flip-flops located in said at least one of said plurality of embedded memory instances, said redundancy scan flip-flops receiving said fuse data from said fuse box register at reset of said integrated semiconductor device.

15. The memory compiler as set forth in claim 14, wherein said plurality of redundancy scan flip-flops are organized into a scan register and said faulty memory portion includes a faulty wordline, a portion of said scan register containing an address of said faulty wordline, and further wherein said scan register is coupled to a comparator provided for comparing a row address with said address of said faulty wordline, said comparator generating a control signal for effectuating a replacement of said faulty wordline with a wordline provided in said redundant portion when there is a match between said row address and said address of said faulty wordline.

16. The memory compiler as set forth in claim 14, further including a plurality of 2:1 multiplexers, the output of each of which is provided to a corresponding column I/O of said at least one memory instance, each 2:1 multiplexer receiving inputs from two sense amplifiers coupled to adjacent column blocks, including a redundant column block provided in said redundant portion, wherein said faulty memory portion includes a faulty column block, wherein said plurality of redundancy scan flip-flops are organized into a scan register, the contents of which provide control signals to said 2:1 multiplexers for steering one of their respective sense amplifier inputs to the corresponding column I/O.

17. The memory compiler as set forth in claim 14, wherein said plurality of redundancy scan flip-flops are organized into a row scan register for effectuating wordline redundancy using a comparator for comparing a row address with a faulty wordline address and a column scan register for effectuating bitline redundancy by means of a plurality of 2:1 multiplexers.

18. The memory compiler as set forth in claim 17, wherein said integrated semiconductor device comprises a System-On-Chip (SOC) device, and further wherein said at least one of said plurality of embedded memory instances comprises a DRAM circuit.

19. The memory compiler as set forth in claim 17, wherein said integrated semiconductor device comprises a System-On-Chip (SOC) device, and further wherein said at least one of said plurality of embedded memory instances comprises an EPROM circuit.

20. The memory compiler as set forth in claim 17, wherein said integrated semiconductor device comprises a System-On-Chip (SOC) device, and further wherein said at least one of said plurality of embedded memory instances comprises a Flash memory circuit.

21. The memory compiler as set forth in claim 17, wherein said integrated semiconductor device comprises a System-On-Chip (SOC) device, and further wherein said at least one of said plurality of embedded memory instances comprises a SRAM circuit.

22. A method of effectuating redundancy in a memory circuit, comprising the steps of:

providing a fuse area outside a main memory area of said memory circuit, said fuse area for storing fuse information corresponding to faulty locations of said main memory area;

providing a plurality of redundancy scan flip-flops in said main memory area;

pre-testing a redundant memory area of said memory circuit before said fuse information is loaded;

testing said main memory area and, if said testing step determines said faulty locations, storing in said fuse area said fuse information corresponding said faulty locations;

upon power-up of said memory circuit, resetting said memory circuit and scanning said fuse information into said plurality of redundancy scan flip-flops; and replacing said faulty locations in said main memory area with locations in said redundant area based on said fuse information in said plurality of redundancy scan flip-flops.

* * * * *

UNITED STATES PATENT AND TRADEMARK OFFICE
CERTIFICATE OF CORRECTION

PATENT NO. : 6,363,020 B1  
DATED : March 26, 2002  
INVENTOR(S) : Shubat et al.

It is certified that error appears in the above-identified patent and that said Letters Patent is hereby corrected as shown below:

Column 14,  
Line 34, "10071" should read -- 1007I --;  
Line 45, "2:1 MLIX" should read -- 2:1 MUX --;  
Line 46, "3:1 MUIX" should read -- 3:1 MUX --.

Signed and Sealed this

Fourth Day of June, 2002

*Attest:*

JAMES E. ROGAN  
*Attesting Officer*     *Director of the United States Patent and Trademark Office*